United States Patent
Morosawa

(10) Patent No.: US 9,362,312 B2
(45) Date of Patent: Jun. 7, 2016

(54) SEMICONDUCTOR DEVICE, DISPLAY UNIT, AND ELECTRONIC APPARATUS

(71) Applicant: Sony Corporation, Tokyo (JP)

(72) Inventor: Narihiro Morosawa, Kanagawa (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 14/218,420

(22) Filed: Mar. 18, 2014

(65) Prior Publication Data
US 2014/0291668 A1 Oct. 2, 2014

(30) Foreign Application Priority Data

Mar. 28, 2013 (JP) ................................. 2013-067983

(51) Int. Cl.
*H01L 27/12* (2006.01)
*H01L 29/786* (2006.01)

(52) U.S. Cl.
CPC ........ *H01L 27/1225* (2013.01); *H01L 27/1255* (2013.01); *H01L 29/78693* (2013.01); *H01L 29/78696* (2013.01)

(58) Field of Classification Search
CPC ............ H01L 27/1225; H01L 27/1255; H01L 29/78696; H01L 29/78693
USPC .......... 257/37, 43, 52, 71, 613–615; 338/277; 438/99, 104, 488, 911
See application file for complete search history.

(56) References Cited

U.S. PATENT DOCUMENTS

| 2012/0001167 A1* | 1/2012 | Morosawa ...................... 257/43 |
| 2012/0273773 A1* | 11/2012 | Ieda et al. ...................... 257/43 |
| 2013/0015457 A1* | 1/2013 | You ................................ 257/71 |
| 2013/0023087 A1* | 1/2013 | Yamazaki et al. ............ 438/104 |
| 2013/0033925 A1* | 2/2013 | Yamazaki et al. ............ 365/149 |

FOREIGN PATENT DOCUMENTS

JP 2007-220817 8/2007

OTHER PUBLICATIONS

Ryo Hayashi et al., "42.1: Invited Paper: Improved Amorphous In-Ga-Zn-O TFTs," SID 08 Digest, pp. 621-624. (4 pages).
Jaechul Park et al., "Self-aligned top-gate amorphous gallium indium zinc oxide thin film transistors," Applied Physics Letters, vol. 93, 053501, 2008. (3 pages).

* cited by examiner

*Primary Examiner* — Michelle Mandala
(74) *Attorney, Agent, or Firm* — K&L Gates LLP

(57) ABSTRACT

Provided is a semiconductor device that includes a transistor. The transistor includes: a gate electrode; an oxide semiconductor film facing the gate electrode and including a first overlapping region that is overlapped with the gate electrode; a low-resistance region provided in the oxide semiconductor film; and a first separation region provided between the low-resistance region and the first overlapping region.

13 Claims, 18 Drawing Sheets

SEMICONDUCTOR DEVICE, DISPLAY UNIT, AND ELECTRONIC APPARATUS

CROSS REFERENCES TO RELATED APPLICATIONS

The present application claims priority to Japanese Priority Patent Application JP 2013-067983 filed in the Japan Patent Office on Mar. 28, 2013, the entire content of which is hereby incorporated by reference.

BACKGROUND

The present application relates to a semiconductor device using an oxide semiconductor, a display unit including the semiconductor device, and an electronic apparatus.

In an active driving type liquid crystal display unit or organic EL (electroluminescence) display unit, TFT (Thin Film Transistor) is used as a drive element, and an electrical charge corresponding to a signal voltage for writing an image is held in a capacitor. However, when a parasitic capacitance generated at an intersection region between a gate electrode and source-drain electrodes of TFT increases, a signal voltage may be varied to cause deterioration in image quality.

In particular, in the organic EL display unit, when a parasitic capacitance is large, it is necessary to increase a holding capacitance as well. Proportions occupied by wirings, etc. increase in accordance with a layout of pixels. As a result, a probability of a short circuit, etc. among wirings increases and a yield in manufacturing is reduced.

To address such issues, a method of reducing a parasitic capacitance generated at an intersection region between a gate electrode and source-drain electrodes has been proposed for TFT in which an oxide semiconductor such as a zinc oxide (ZnO) or an indium gallium zinc oxide (IGZO) is used for a channel. For example, reference is made to Japanese Unexamined Patent Application Publication No. 2007-220817 (JP2007-220817A). Also, reference is made to J. Park et al., "Self-aligned top-gate amorphous gallium indium zinc oxide thin film transistors", Applied Physics Letters, American Institute of Physics, 2008, volume 93, 053501 (Non Patent Literature 1) and R. Hayashi et al., "Improved Amorphous In—Ga—Zn—O TFTs", SID 08 DIGEST, 2008, 42. 1, p. 621-624 (Non Patent Literature 2).

JP2007-220817A and Non Patent Literature 1 each describe a method in which after a gate electrode and a gate insulating film are provided on a channel region of an oxide semiconductor film in the same position in plain view, a resistance of a region exposed from the gate electrode and the gate insulating film of the oxide semiconductor film is reduced to form a source-drain region (low-resistance region), i.e., each describe a top gate type TFT formed in a so-called self-alignment manner. On the other hand, Non Patent Literature 2 describes a bottom gate type TFT having a self-aligned structure, in which, in the TFT, a source-drain region is formed in an oxide semiconductor film through a backside exposure using a gate electrode as a mask.

SUMMARY

In a transistor having a self-aligned structure as described above, further improvement in withstand voltage characteristics is desired.

It is desirable to provide a semiconductor device, a display unit, and an electronic apparatus each having high withstand voltage characteristics.

A semiconductor device according to an embodiment of the present application includes a transistor. The transistor includes: a gate electrode; an oxide semiconductor film facing the gate electrode and including a first overlapping region that is overlapped with the gate electrode; a low-resistance region provided in the oxide semiconductor film; and a first separation region provided between the low-resistance region and the first overlapping region.

A display unit according to an embodiment of the present application is provided with a display element and a transistor configured to drive the display element. The transistor includes: a gate electrode; an oxide semiconductor film facing the gate electrode and including a first overlapping region that is overlapped with the gate electrode; a low-resistance region provided in the oxide semiconductor film; and a first separation region provided between the low-resistance region and the first overlapping region.

An electronic apparatus according to an embodiment of the present application is provided with a display. The display is provided with a display element and a transistor configured to drive the display element. The transistor includes: a gate electrode; an oxide semiconductor film facing the gate electrode and including a first overlapping region that is overlapped with the gate electrode; a low-resistance region provided in the oxide semiconductor film; and a first separation region provided between the low-resistance region and the first overlapping region.

In the semiconductor device, the display unit, and the electronic apparatus according to the above-described embodiments of the present application, the first separation region is provided between the first overlapping region and the low-resistance region of the oxide semiconductor film. Thus, a distance between a pair of such low-resistance regions (source-drain regions) that interpose the first overlapping region in between extends. That is, even when the first overlapping region is short in length, the distance between the low-resistance regions is adjusted to a desired length.

According to the semiconductor device, the display unit, and the electronic apparatus in the above-described embodiments of the present application, the first separation region is provided between the first overlapping region and the low-resistance region. Therefore, it is possible to improve withstand voltage characteristics of the transistor.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the present disclosure, and are incorporated in and constitute a part of this specification. The drawings illustrate embodiments and, together with the specification, serve to describe the principles of the technology.

FIG. 15 is a plan view illustrating an outline configuration of a module including the display unit according to any of the embodiments and the like.

FIG. 16A is a perspective view illustrating an appearance of an application example 1 of the display unit according to any of the embodiments and the like.

DETAILED DESCRIPTION

Hereinafter, some embodiments of the present application are described in detail with reference to the accompanying drawings. The description will be given in the following order.

Figure 1:
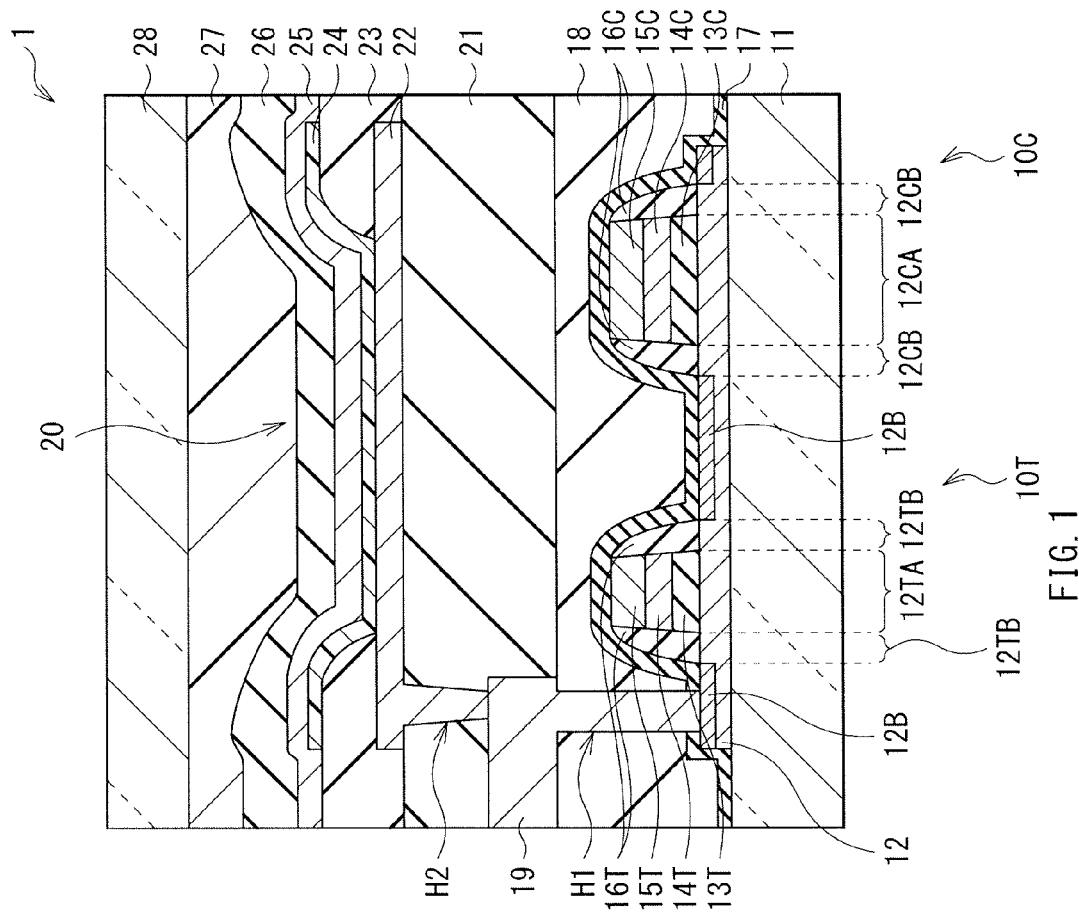
FIG. 1 is a cross-sectional view illustrating a configuration of a display unit according to a first embodiment of the present application.

1. First Embodiment (Example where a top-gate type transistor has a separation region: an organic EL display unit)
2. Modification Example (Example where a conductive film is provided between an oxide semiconductor film and a capacitor insulating film)
3. Second Embodiment (Example where a bottom-gate type transistor has a separation region)
4. Third Embodiment (Liquid crystal display unit)
5. Fourth Embodiment (Electronic paper)
6. Application Examples First Embodiment FIG. 1 illustrates a cross-sectional configuration of a display unit (display unit 1) according to a first embodiment of the present application. The display unit 1 is an active-matrix type organic EL (Electroluminescence) display unit, and has a plurality of transistors 10T and a plurality of organic EL elements 20 driven by the transistors 10T on a substrate 11. In FIG. 1, a region (sub-pixel) corresponding to one of the transistors 10T and one of the organic EL elements 20 is illustrated.

The transistor 10T may be TFT having a staggered structure (top-gate type TFT) that includes an oxide semiconductor film 12, a gate insulating film 13T, and a gate electrode 14T in this order on the substrate 11. An etching resistant film 15T is provided on the gate electrode 14T, and a sidewall 16T covers side surfaces of the etching resistant film 15T, the gate electrode 14T, and the gate insulating film 13T. The sidewall 16T and the etching resistant film 15T are covered with a high-resistance film 17, and an inter-layer insulating film 18 is provided on the high-resistance film 17. Source-drain electrodes 19 are electrically connected to the oxide semiconductor film 12 through a connection hole H1 of the inter-layer insulating film 18 and the high-resistance film 17.

The display unit 1 (semiconductor device) has a capacitor 10C that shares the oxide semiconductor film 12 with the transistor 10T. The organic EL element 20 is provided on the transistor 10T and the capacitor 10C with a planarizing film 21 interposed in between.

(Transistor 10T)

The substrate 11 may be made of a plate material such as quartz, glass, silicon, or a resin (plastic) film. Since the oxide semiconductor film 12 may be formed without heating the substrate 11 by using a later-described sputtering method, an inexpensive resin film may be used. Examples of resin material may include PET (polyethylene terephthalate) and PEN (polyethylene naphthalate). Besides those materials, a metal substrate such as stainless steel (SUS) may be used in accordance with purposes.

The oxide semiconductor film 12 is provided in a selective region on the substrate 11, and has a function as an active layer of the transistor 10T. The oxide semiconductor film 12 may include, as a main component, an oxide of one or more elements of indium (In), gallium (Ga), zinc (Zn), and tin (Sn), for example. Specifically, examples may include, as an amorphous oxide semiconductor material, an indium tin zinc oxide (ITZO) and an indium gallium zinc oxide (IGZO: InGaZnO), and may include, as a crystalline oxide semiconductor material, an zinc oxide (ZnO), an indium zinc oxide (IZO (registered trademark)), an indium gallium oxide (IGO), an indium tin oxide (ITO), and an indium oxide (InO). Although either of amorphous oxide semiconductor material or crystalline oxide semiconductor material may be used, crystalline oxide semiconductor materials may be preferably used since etching selectivity with respect to the gate insulating film 13T is easily secured. A thickness (thickness in a laminated direction, hereinafter referred to simply as "thickness") of the oxide semiconductor film 12 may be, for example, about 50 nm.

The oxide semiconductor film 12 faces the gate electrode 14T which serves as an upper layer thereof, and includes an overlapping region 12TA that is overlapped with the gate electrode 14T. The oxide semiconductor film 12 is provided with a pair of low-resistance regions 12B (source-drain regions) with the overlapping region 12TA interposed in between. The low-resistance region 12B is a region lower than the overlapping region 12TA in electric resistance, and may be partially provided, for example, in a thickness direction from a surface (upper surface) of the oxide semiconductor film 12. The low-resistance region 12B is formed by reacting a metal such as aluminum (Al) with an oxide semiconductor material and diffusing the metal (dopant). In the transistor 10T, a self-aligned structure is achieved through the low-resistance region 12B. Further, the low-resistance region 12B also serves to stabilize characteristics of the transistor 10T.

In the present embodiment, the overlapping region 12TA and the low-resistance regions 12B of the oxide semiconductor film 12 are separated from one another by a predetermined distance (separation region 12TB). The separation region 12TB (offset region) allows adjustment of a length between the pair of low-resistance regions 12B. Therefore, even when the overlapping region 12TA of the oxide semiconductor film 12 is short in length, it is possible to improve withstand voltage characteristics of the transistor 10T.

Figure 2:
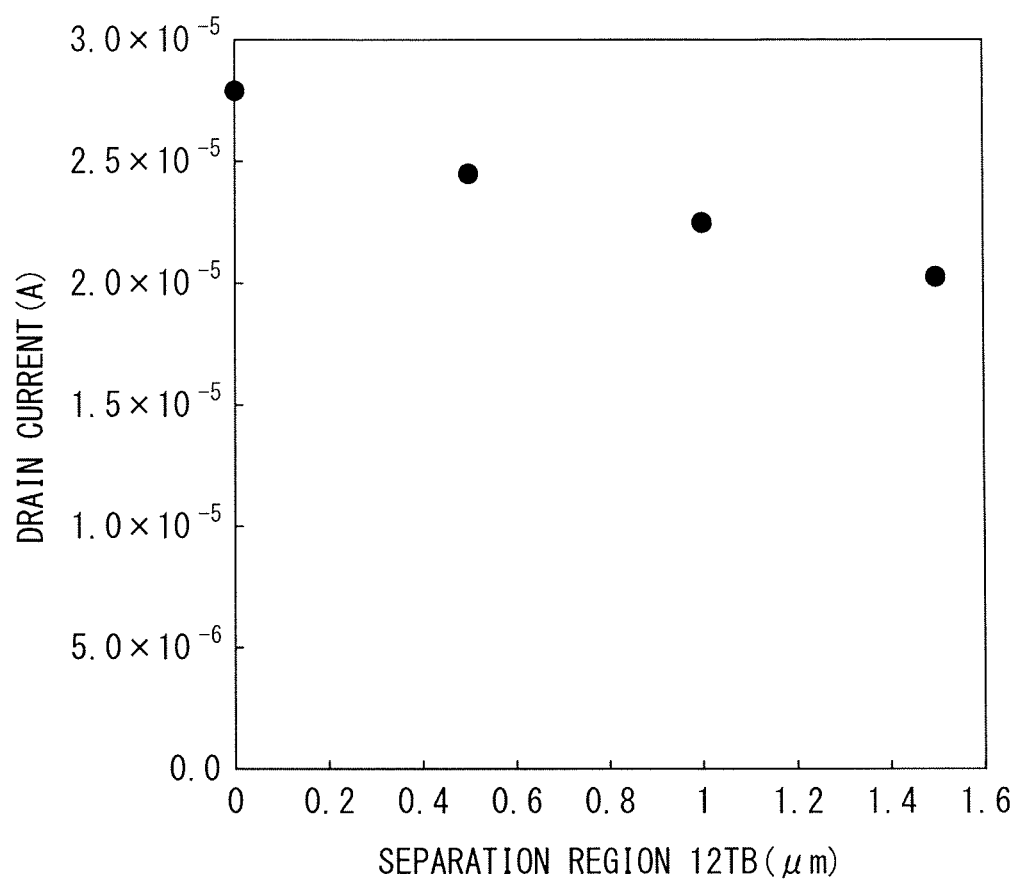
FIG. 2 illustrates a relationship between a drain current and a length of a separation region illustrated in FIG. 1.

As described later, the separation region 12TB is formed by the sidewall 16T, and a length of the separation region 12TB is the same as a width (X direction) of the sidewall 16T that is in contact with the oxide semiconductor film 12. As illustrated in FIG. 2, as the separation region 12TB is longer, a drain current is more reduced. It is preferable that the transistor 10T have high withstand voltage characteristics and maintain a drain current amount to a predetermined value. For example, the separation region 12TB may be preferably suppressed up to about 0.5 μm.

The gate electrode 14T is provided on the oxide semiconductor film 12 with the gate insulating film 13T interposed in between. The gate insulating film 13T may have, for example, a thickness of about 300 nm, and may be configured by a single layer film including one of a silicon oxide film (SiO), a silicon nitride film (SiN), a silicon nitride oxide film (SiON), and an aluminum oxide film (AlO), or by a laminated film including two or more thereof. For the gate insulating film 13T, a material which makes it difficult to reduce the oxide semiconductor film 12, such as a silicon oxide film or an aluminum oxide film, may be preferably used.

Figure 3A:
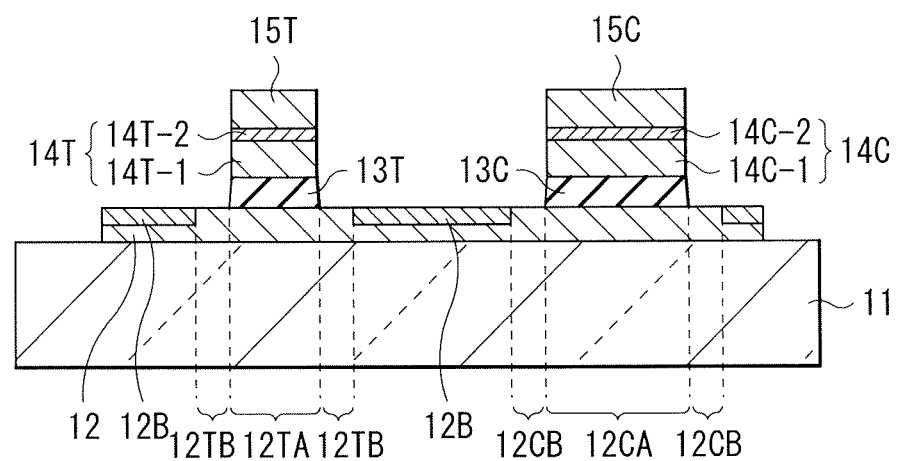
FIG. 3A is a cross-sectional view illustrating one example of a configuration of a gate electrode illustrated in FIG. 1.
Figure 3B:
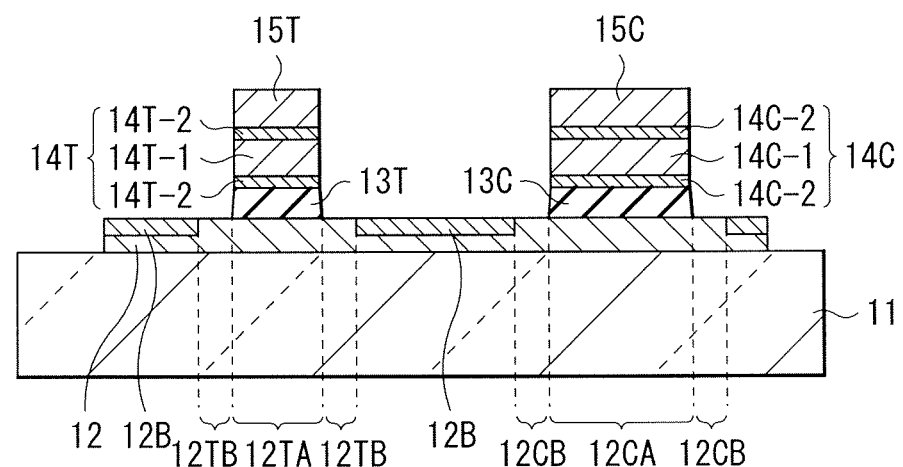
FIG. 3B is a cross-sectional view illustrating another example of a configuration of the gate electrode illustrated in FIG. 1.

The gate electrode 14T controls a carrier density in the oxide semiconductor film 12 (the overlapping region 12TA and the separation region 12TB) by a gate voltage (Vg) applied to the transistor 10T, and has a function as wiring for supplying potentials. The gate electrode 14T may be made of, for example, a simple substance including one of molybdenum (Mo), molybdenum nitride (MoN), titanium (Ti), titanium nitride (TiN), aluminum (Al), silver (Ag), neodymium (Nd), and copper (Cu), or an alloy thereof. The gate electrode 14T may have a laminated structure in which a plurality of simple substances or an alloy is used. The gate electrode 14T may be preferably made of a low-resistance metal such as an aluminum alloy (Al—Nd) containing aluminum and neodymium, or copper. On a layer (low-resistance layer 14T-1) made of the above-described low-resistance metal, for example, a layer (barrier layer 14T-2) made of titanium, titanium nitride, molybdenum, or molybdenum nitride may be laminated (FIGS. 3A and 3B). When the barrier layer 14T-2 is interposed between the low-resistance layer 14T-1 and the etching resistant film 15T made of, for example, an oxide, a contact performance between the gate electrode 14T and the etching resistant film 15T is increased. Providing the barrier layer 14T-2 between the low-resistance layer 14T-1 and the gate insulating film 13T (FIG. 3B) makes it easier to control a shape of the gate electrode 14T as described later. The gate electrode 14T may be configured by a transparent conductive film such as ITO. A thickness of the gate electrode 14T may be, for example, in a range from 10 nm to 500 nm. The gate electrode 14T and the gate insulating film 13T each have the same shape as each other in plain view.

The etching resistant film 15T functions as an etching stopper at the time of forming the sidewall 16T, and is made of a material that shows etching resistance higher than that of the gate electrode 14T under predetermined conditions. For the etching resistant film 15T, an oxide such as ITO, IZO, and IGZO may be used, and a thickness thereof may be, for example, 50 nm. Planar shapes of the etching resistant film 15T, the gate electrode 14T, and the gate insulating film 13T are substantially the same as one another.

The sidewall 16T covers side surfaces of the etching resistant film 15T, the gate electrode 14T, and the gate insulating film 13T, as well as a part (separation region 12TB) of the oxide semiconductor film 12. A thickness (Z direction) of the sidewall 16T is substantially equal to a sum of thicknesses of, for example, the gate insulating film 13T, the gate electrode 14T, and the etching resistant film 15T, and a length of the separation region 12TB is controlled by the thickness and the width of the sidewall 16T. The sidewall 16T may be configured by an inorganic insulating film such as a silicon oxide film, a silicon oxynitride film, and a silicon nitride film. A plurality of inorganic insulating films may be laminated to configure the sidewall 16T.

The high-resistance film 17 covers the sidewall 16T from an upper surface of the etching resistant film 15, and is in contact with the oxide semiconductor film 12 (low-resistance region 12B) exposed from the sidewall 16T. The high-resistance film 17 covers also the capacitor 10C. The high-resistance film 17 is a resultant of a metal film, which serves as a supply source of a metal diffused into the low-resistance region 12B of the oxide semiconductor film 12, is oxidized and left in a manufacturing process to be described later. The high-resistance film 17 may have, for example, a thickness of about 20 nm or less, and is configured by a titanium oxide, an aluminum oxide, an indium oxide, a tin oxide, or the like. A plurality of such oxides may be laminated. This high-resistance film 17 also has a function of reducing an influence of oxygen and moisture that vary electrical characteristics of the oxide semiconductor film 12 in the transistor 10T, namely, a barrier function, besides its role on the process as described above. Accordingly, by providing the high-resistance film 17, it is possible to stabilize electrical characteristics of the transistor 10T and the capacitor 10C, and to further increase an effect of the inter-layer insulating film 18.

To increase the barrier function, for example, a protective film made of an aluminum oxide or silicon nitride having a thickness of about 30 nm to about 50 nm may be laminated on the high-resistance film 17. Thereby, electrical characteristics of the oxide semiconductor film 12 in the transistor 10T are more stabilized.

The inter-layer insulating film 18 is provided on the high-resistance film 17, and extends to the outside of the transistor 10T and covers the capacitor 10C in the same manner as the high-resistance film 17. The inter-layer insulating film 18 may be made of an organic material such as acrylic resin, polyimide, or siloxane, or an inorganic material such as a silicon oxide film, a silicon nitride film, a silicon oxynitride film, or an aluminum oxide. The above-described organic material and inorganic material may be laminated. In the inter-layer insulating film 18 including the organic material, it is possible to easily increase a thickness thereof to, for example, about 2 μm. The inter-layer insulating film 18 thus increased in thickness secures an insulation property by sufficiently covering a step formed after the process of the gate electrode 14T. The inter-layer insulating film 18 in which a silicon oxide film and an aluminum oxide film are laminated suppresses contamination and diffusion of moisture to the oxide semiconductor film 12. As a result, electrical characteristics of the transistor 10T are stabilized and also reliability is improved.

The source-drain electrodes 19 are patterned and provided on the inter-layer insulating film 18. Further, the source-drain electrodes 19 are connected to the low-resistance region 12B of the oxide semiconductor film 12 through the connection hole H1 (through-hole) that penetrates the inter-layer insulating film 18 and the high-resistance film 17. The source-drain electrodes 19 may be desirably provided by avoiding a portion over the gate electrode 14T. One reason is that the parasitic capacitance is prevented from being generated in an intersection region between the gate electrode 14T and the source-drain electrodes 19. The source-drain electrodes 19 may have, for example, a thickness of about 500 nm, and may be made of the same metal material or the same material of the transparent conductive film as the gate electrode 14T as described above. The source-drain electrodes 19 may be preferably made of a low-resistance metal material such as aluminum or copper as well, and more preferably made of a laminated film of a low-resistance layer and a barrier layer. Configuring the source-drain electrodes 19 by the above-described laminated film makes it possible to perform driving with a small wiring delay. Using an aluminum alloy containing neodymium or ITO for an uppermost layer (a layer facing the organic EL element 20) of the source-drain electrodes 19 makes it possible to allow a part (the uppermost layer) of the source-drain electrodes 19 to function as a first electrode 22 of the organic EL element 20. This makes it possible to eliminate the first electrode 22.

(Capacitor 10C)

The capacitor 10C is provided on the substrate 11 together with the transistor 10T, and may hold, for example, an electrical charge in a pixel circuit 50A to be described later. The capacitor 10C has the oxide semiconductor film 12 that is shared with the transistor 10T, a capacitor insulating film 13C, a capacitor electrode 14C, and an etching resistant film 15C in this order from the substrate 11 side. That is, one electrode of the capacitor 10C is configured by the capacitor electrode 14C, and the other electrode is configured by the oxide semiconductor film 12.

The oxide semiconductor film 12 of the capacitor 10C faces the capacitor electrode 14C, and includes an overlapping region 12CA that is overlapped with the capacitor electrode 14C. In the same manner as the transistor 10T, a separation region 12CB is present between the overlapping region 12CA and the low-resistance region 12B. The separation region 12CB is in contact with a sidewall 16C that covers side surfaces of the etching resistant film 15C, the capacitor electrode 14C, and the capacitor insulating film 13C.

The capacitor insulating film 13C may be formed, for example, in the same layer as that of the gate insulating film 13T through the same process as that of the gate insulating film 13T. Further, the capacitor insulating film 13C may be made of the same material as that of the gate insulating film 13T, and may have the same film thickness as that of the gate insulating film 13T. The capacitor insulating film 13C may be made of an inorganic insulating material, by which the capacitor 10C having a large capacitance is obtained. Also, the capacitor electrode 14C and the etching resistant film 15C may be configured, for example, in the same layers as those of the gate electrode 14T and the etching resistant film 15T through the same process as those of the gate electrode 14T and the etching resistant film 15T, respectively. Further, the capacitor electrode 14C and the etching resistant film 15C may be made of the same materials as those of the gate electrode 14T and the etching resistant film 15T, respectively, and may have the same film thicknesses as those of the gate electrode 14T and the etching resistant film 15T, respectively. In the same manner as the gate electrode 14T, the capacitor electrode 14C may have a laminated structure of a low-resistance layer 14C-1 and a barrier layer 14C-2 (FIGS. 3A and 3B). The capacitor insulating film 13C and the gate insulating film 13T, the capacitor electrode 14C and the gate electrode 14T, and the etching resistant film 15C and the etching resistant film 15T may be formed in the processes different from each other, may be formed by materials different from each other, or may be formed at film thicknesses different from each other.

The sidewall 16C of the capacitor 10C covers the etching resistant film 15C, the capacitor electrode 14C, and the capacitor insulating film 13C from the side surfaces thereof, as well as a part (separation region 12CB) of the oxide semiconductor film 12. In the same manner as the sidewall 16T of the transistor 10T, a length of the separation region 12CB may be controlled by adjusting a width of the sidewall 16C. The sidewall 16C may be formed through the same process as that of the sidewall 16T by the same material as that of the sidewall 16T. The sidewalls 16C and 16T may be formed through the processes different from each other, and may be formed by materials different from each other.

(Organic EL Element 20)

The organic EL element 20 is provided on the planarizing film 21. The organic EL element 20 has the first electrode 22, a pixel separation film 23, an organic layer 24, and a second electrode 25 in this order from the planarizing film 21 side, and is sealed by a protective layer 26. A sealing substrate 28 is adhered to the protective layer 26 with an adhesion layer 27 made of a thermosetting resin or an ultraviolet setting resin interposed in between. The display unit 1 may be of a bottom emission type that allows light generated at the organic layer 24 to be taken out from the substrate 11 side, or of a top emission type that allows the light to be taken out from the sealing substrate 28 side.

The planarizing film 21 may be provided over an entire display region (display region 50 in FIG. 4 to be described later) of the substrate 11 on the source-drain electrodes 19 and the inter-layer insulating film 18, and has a connection hole H2. The connection hole H2 connects the source-drain electrodes 19 of the transistor 10T and the first electrode 22 of the organic EL element 20. The planarizing film 21 may be made of, for example, polyimide or acrylic resin.

The first electrode 22 is so provided on the planarizing film 21 as to embed the connection hole H2. The first electrode 22 may function as an anode, for example, and is provided for each element. In the case where the display unit 1 is of the bottom emission type, the first electrode 22 may be configured by a transparent conductive film, which may be, for example, a single layer film including any one of an indium tin oxide (ITO), an indium zinc oxide (IZO), and an indium zinc oxide (InZnO), or a laminated film including two or more thereof. On the other hand, in the case where the display unit 1 is of the top emission type, the first electrode 22 may be configured by a reflective metal, which may be a simple substance metal including one or more of aluminum (Al), magnesium (Mg), calcium (Ca), and sodium (Na), a single layer film including an alloy containing one or more thereof, or a multilayer film in which the simple substance metals or the alloys are laminated.

The first electrode 22 may be provided so as to be in contact with a surface (a surface of the organic EL element 20 side) on the source-drain electrodes 19. As a result, it is possible to omit the planarizing film 21 and to reduce the number of processes to manufacture the display unit 1.

The pixel separation film 23 secures an insulation property between the first electrode 22 and the second electrode 25, and defines and separates a light-emitting region of each element. Further, the pixel separation film 23 has openings that face the light-emitting regions of the respective elements. The pixel separation film 23 may be configured by a photosensitive resin such as polyimide, acrylic resin, or novolac-based resin.

The organic layer 24 is so provided as to cover the openings of the pixel separation film 23. The organic layer 24 includes an organic electroluminescent layer (organic EL layer) and causes emission of light by an application of a drive current. The organic layer 24 may have, for example, a hole injection layer, a hole transport layer, an organic EL layer, and an electron transport layer in this order from the substrate 11 (first electrode 22) side. Recombination of holes and electrons occurs in the organic EL layer and light is thus generated. A constituent material of the organic EL layer may be a general low-molecular or high-molecular organic material, and is not particularly limited. For example, the organic EL layers that emit red, green, and blue light beams may be provided individually for respective pixels. Alternatively, the organic EL layer (e.g., a multilayer of the organic EL layers of red, green, and blue) that emits white light may be provided over the entire surface of the substrate 11. The hole injection layer increases hole injection efficiency and prevents a leakage, and the hole transport layer increases hole transport efficiency to the organic EL layer. Layers other than the organic EL layer such as the hole injection layer, the hole transport layer, or the electron transport layer may be provided on an as-necessary basis.

The second electrode 25 may function as, for example, a cathode and is configured by a metal conductive film. In the case where the display unit 1 is of the bottom emission type, the second electrode 25 may be configured by a reflective metal, which may be a simple substance metal including one or more of aluminum (Al), magnesium (Mg), calcium (Ca), and sodium (Na), a single layer film including an alloy containing one or more thereof, or a multilayer film in which the simple substance metals or the alloys are laminated. On the other hand, in the case where the display unit 1 is of the top emission type, a transparent conductive film such as ITO and IZO is used for the second electrode 25. The second electrode 25 is provided, for example, in common for each element in a state where the second electrode 25 is insulated from the first electrode 22.

The protective layer 26 may be made of any one of an insulating material and a conducting material. Examples of the insulating material may include amorphous silicon (a-Si), amorphous silicon carbide (a-SiC), amorphous silicon nitride ($a\text{-Si}_{(1-X)}N_X$), and amorphous carbon (a-C).

The sealing substrate 28 is so arranged as to face the substrate 11 with the transistor 10T, the capacitor 10C, and the organic EL element 20 interposed in between. For the sealing substrate 28, the same material as that of the substrate 11 may be used. In the case where the display unit 1 is of the top emission type, a transparent material may be used for the sealing substrate 28, and a color filter and a light-shielding film may be provided on the sealing substrate 28 side. In the case where the display unit 1 is of the bottom emission type, the substrate 11 may be made of a transparent material and, for example, a color filter and a light-shielding film may be provided on the substrate 11 side.

(Configuration of Peripheral Circuit and Pixel Circuit)

Figure 4:
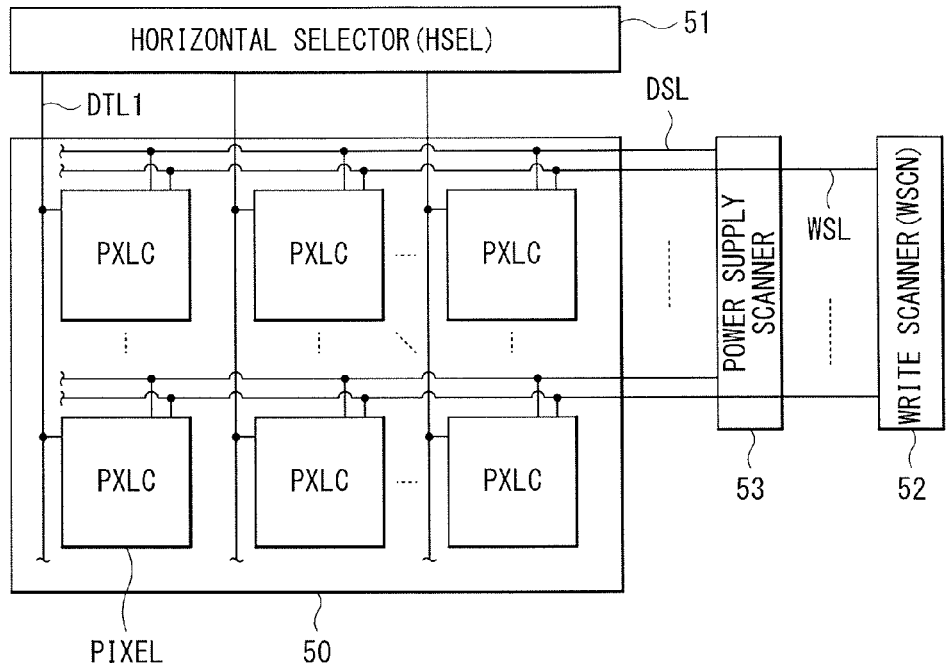
FIG. 4 illustrates an overall configuration including a peripheral circuit of the display unit illustrated in FIG. 1.

As illustrated in FIG. 4, the display unit 1 has a plurality of pixel PXLCs including the above-described organic EL element 20, and the pixel PXLC may be arranged in the display region 50 of the substrate 11, for example, in a form of a matrix. A horizontal selector (HSEL) 51 as a signal line drive circuit, a write scanner (WSCN) 52 as a scanning line drive circuit, and a power supply scanner 53 as a power supply line drive circuit are provided around the display region 50.

In the display region 50, a plurality of (integer n-number of) signal lines DTL1 to DTLn are arranged in a column direction, and a plurality of (integer m-number of) scanning lines WSL1 to WSLm are arranged in a row direction. Further, each intersection of the signal lines DTL and the scanning lines WSL is provided with the pixel PXLC (one of the pixels corresponding to R, G, and B). Each signal line DTL is electrically connected to the horizontal selector 51, and an image signal is supplied to each pixel PXLC from the horizontal selector 51 through the signal line DTL. On the other hand, each scanning line WSL is electrically connected to the write scanner 52, and a scanning signal (selection pulse) is supplied to each pixel PXLC from the write scanner 52 through the scanning line WSL. Each power supply line DSL is connected to the power supply scanner 53, and a power supply signal (control pulse) is supplied to each pixel PXLC from the power supply scanner 53 through the power supply line DSL.

Figure 5:
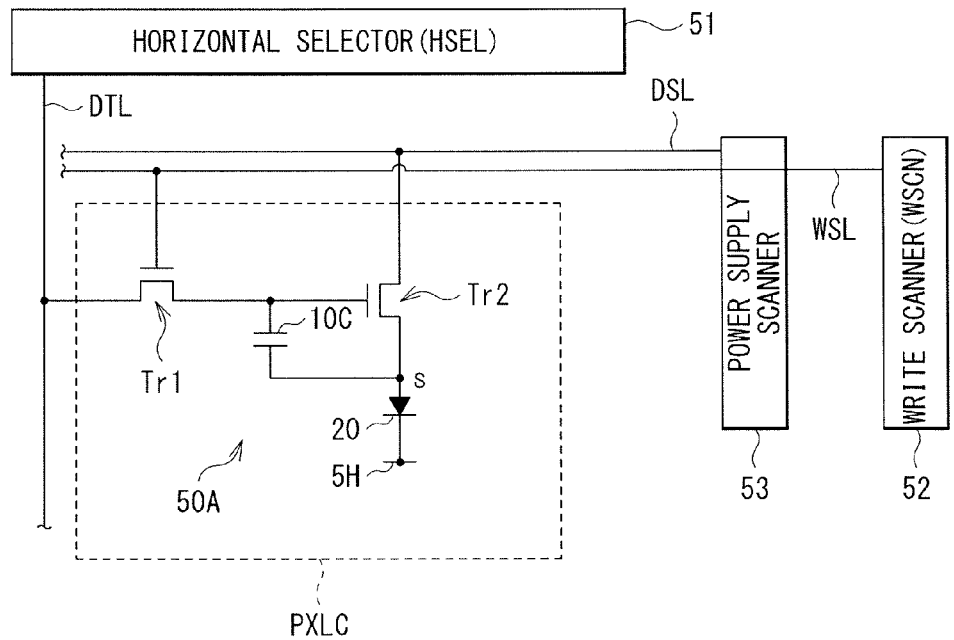
FIG. 5 illustrates a circuit configuration of a pixel illustrated in FIG. 4.

FIG. 5 illustrates a specific example of a circuit configuration of the pixel PXLC. Each pixel PXLC has the pixel circuit 50A including the organic EL element 20. The pixel circuit 50A is an active drive circuit having a sampling transistor Tr1, a driving transistor Tr2, the capacitor 10C, and the organic EL element 20. Note that, one or both of the sampling transistor Tr1 and the driving transistor Tr2 correspond to the above-described transistor 10T.

The sampling transistor Tr1 has a gate connected to the corresponding scanning line WSL, and one of a source and a drain thereof is connected to the corresponding signal line DTL. Further, the other of the source and the drain is connected to a gate of the driving transistor Tr2. The driving transistor Tr2 has a drain connected to the corresponding power supply line DSL, and a source thereof is connected to an anode of the organic EL element 20. Further, a cathode of the organic EL element 20 is connected to a ground wiring 5H. Note that the ground wiring 5H is wired in common to all of the pixels PXLC. The capacitor 10C is arranged between the source and the gate of the driving transistor Tr2.

The sampling transistor Tr1 is brought into conduction in accordance with the scanning signal (selection pulse) supplied from the scanning line WSL. Thereby, the sampling transistor 3A samples a signal potential of an image signal supplied from the signal line DTL, and holds the sampled signal potential in the capacitor 10C. The driving transistor Tr2 receives the supply of a current from the power supply line DSL set at a predetermined first potential (not illustrated), and supplies a drive current to the organic EL element 20 in accordance with the signal potential held in the capacitor 10C. Through the drive current supplied from the driving transistor Tr2, the organic EL element 20 emits light with luminance that corresponds to the signal potential of the image signal.

In the above-described circuit configuration, the sampling transistor Tr1 is brought into conduction in accordance with the scanning signal (selection pulse) supplied from the scanning line WSL. Thereby, a signal potential of the image signal supplied from the signal line DTL is sampled, and held in the capacitor 10C. Further, a current is supplied to the driving transistor Tr2 from the power supply line DSL set at the first potential. In accordance with the signal potential held in the capacitor 10C, the drive current is supplied to the organic EL element 20 (each of the organic EL elements of red, green, and blue). Further, through the supplied drive current, each of the organic EL elements 20 emits light with luminance that corresponds to the signal potential of the image signal. Thereby, in the display unit 1, an image is displayed on the basis of the image signal.

The display unit 1 may be, for example, manufactured as follows.

(Process of Forming Transistor 10T and Capacitor 10C)

Figure 6A:
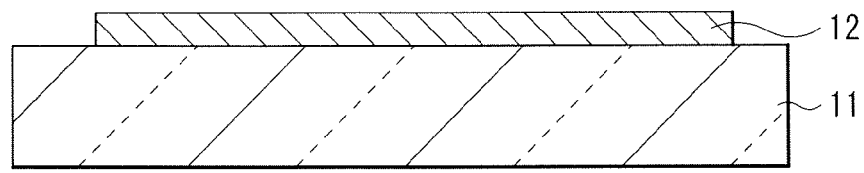
FIG. 6A is a cross-sectional view illustrating a method of manufacturing the display unit illustrated in FIG. 1.

First, as illustrated in FIG. 6A, the oxide semiconductor film 12 made of the above-described material is formed on the substrate 11. Specifically, for example, by using a sputtering method, an oxide semiconductor material film (not illustrated) is first formed, for example, at a thickness of about 50 nm over the entire surface of the substrate 11. On this occasion, a ceramic having the same composition as that of an oxide semiconductor being a film formation object may be used as a target. Further, since a carrier concentration in the oxide semiconductor largely depends on an oxygen partial pressure during the sputtering, the oxygen partial pressure is controlled so that a predetermined transistor characteristic is obtained. When the oxide semiconductor film 12 is made of the above-described crystalline material, etching selectivity is easily improved in an etching process to be described later of the gate insulating film 13T. Then, the formed oxide semiconductor material film is patterned in a predetermined shape, for example, by using a photolithography method and an etching method. On this occasion, the oxide semiconductor material film may be preferably processed through a wet etching using a mixed liquid of a phosphoric acid, a nitric acid, and an acetic acid. The mixed liquid of a phosphoric acid, a nitric acid, and an acetic acid makes it possible to sufficiently increase selectivity with respect to a foundation layer and to perform the process relatively easily.

Figure 6B:
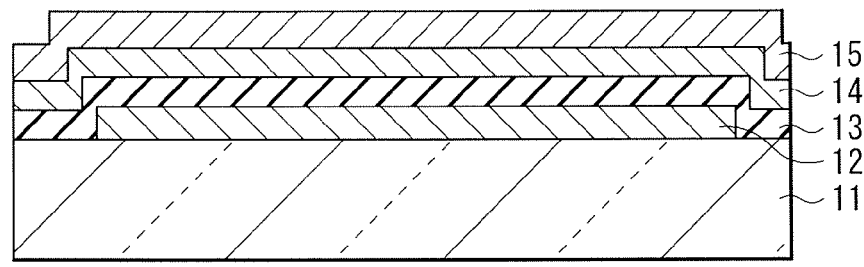
FIG. 6B is a cross-sectional view illustrating a process following FIG. 6A.

As illustrated in FIG. 6B, after the oxide semiconductor film 12 is provided, for example, an insulating film 13 made of a silicon oxide film or an aluminum oxide film having a thickness of 300 nm, a conductive film 14 made of a metal material such as molybdenum, titanium, copper, or aluminum, and the etching resistant film 15 made of an oxide such as ITO, IZO, or IGZO are formed in this order over the entire surface of the substrate 11. As described in the gate electrode 14T, for example, a low-resistance layer made of copper or aluminum and a barrier layer made of molybdenum or titanium may be laminated as the conductive film 14. The insulating film 13 may be formed, for example, by using a plasma CVD (Chemical Vapor Deposition) method. Besides the plasma CVD method, it is possible to form the insulating film 13 made of a silicon oxide film by using a reactive plasma sputtering method. Further, in the case where an aluminum oxide film is used for the insulating film 13, it is possible to use an atomic layer deposition method besides the reactive plasma sputtering method and the plasma CVD method. The conductive film 14 and the etching resistant film 15 may be formed, for example, by using the sputtering method.

After the etching resistant film 15 is formed over the entire surface of the substrate 11, the etching resistant film 15 and the conductive film 14 are patterned, for example, by using the photolithography method and the etching method. Thereby, the gate electrode 14T and the capacitor electrode 14C are formed together with the etching resistant films 15T and 15C in a selective region of the oxide semiconductor film 12. At this time, for example, a barrier layer which may be made of titanium may be provided at a lowermost layer (layer facing the insulating film 13) of the conductive film 14 (FIG. 3B) to allow formation of the uniform, fine gate electrode 14T. This is because, in the gate electrode 14T having the above-described configuration, it is possible to use a dry etching method for the barrier layer after the etching resistant film 15 and the low-resistance layer of the conductive film 14 are processed by using the wet etching method, and thereby a shape of the gate electrode 14T is accurately controlled by using the dry etching method.

Figure 6C:
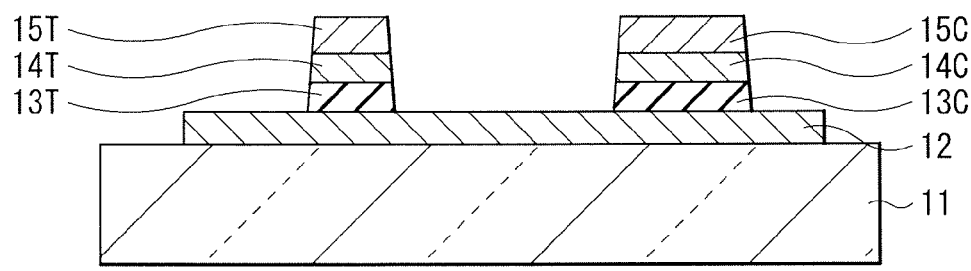
FIG. 6C is a cross-sectional view illustrating a process following FIG. 6B.

Subsequently, the insulating film 13 is etched using the etching resistant films 15T and 15C, the gate electrode 14T, and the capacitor electrode 14C as a mask. As a result, the gate insulating film 13T, the gate electrode 14T, and the etching resistant film 15T are patterned substantially in the same shape as one another in plain view. At the same time, the capacitor insulating film 13C, the capacitor electrode 14C, and the etching resistant film 15C also are formed substantially in the same shape as one another in plain view (FIG. 6C). At this time, in the case where the oxide semiconductor film 12 is made of the crystalline material as described above, chemical such as a hydrofluoric acid may be used in the etching process to allow easier process while keeping an extremely large etching selectivity. After the gate electrode 14T and the gate insulating film 13T are formed, the capacitor insulating film 13C and the capacitor electrode 14C of the capacitor 10C may be formed by using materials different from those of the insulating film 13 and the conductive film 14.

Figure 6D:
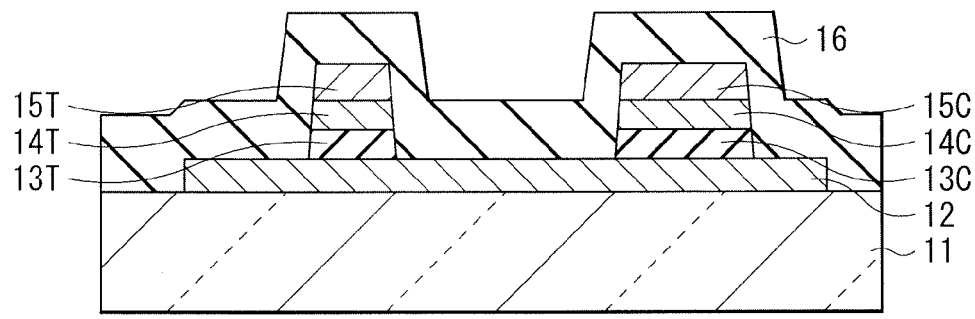
FIG. 6D is a cross-sectional view illustrating a process following FIG. 6C.

As illustrated in FIG. 6D, after the gate insulating film 13T and the capacitor insulating film 13C are provided, an insulating film 16 such as a silicon oxide film or a silicon nitride film is formed over the entire surface of the substrate 11. The insulating film 16 may be formed to have a thickness equal to or greater than the sum of thicknesses of the gate insulating film 13T, the gate electrode 14T, and the etching resistant film 15T.

Figure 7A:
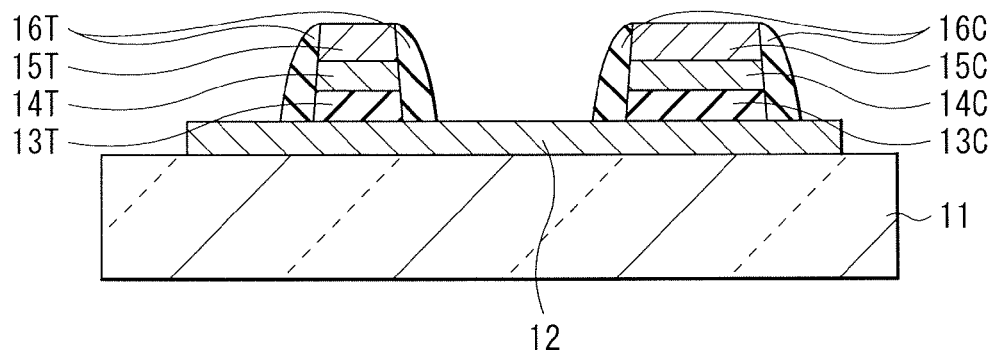
FIG. 7A is a cross-sectional view illustrating a process following FIG. 6D.

Subsequently, dry etching using gas containing fluorine may be performed, for example, on the substrate 11 as a whole. At this time, the etching resistant films 15T and 15C function as an etching stopper, and the sidewalls 16T and 16C are formed from the insulating film 16 (FIG. 7A).

Figure 7B:
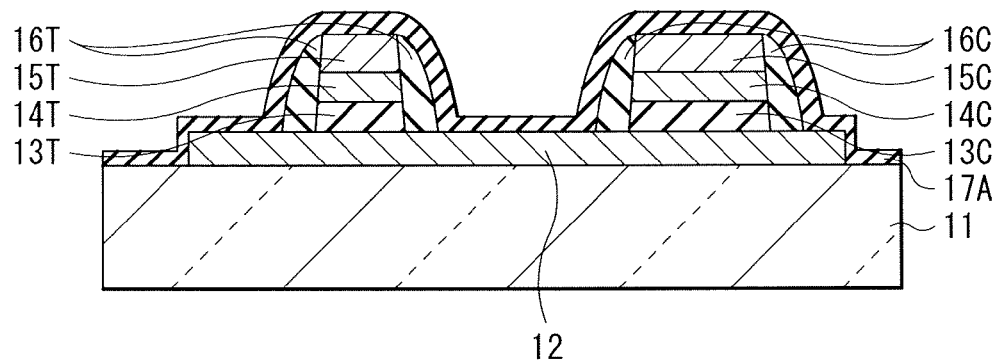
FIG. 7B is a cross-sectional view illustrating a process following FIG. 7A.

Then, as illustrated in FIG. 7B, a metal film 17A made of, for example, titanium, aluminum, tin, or indium may be formed over the entire surface of the substrate 11, for example, at a thickness in a range from 5 nm to 10 nm, for example, by using the sputtering method or the atomic layer deposition method. The metal film 17A may be made of a metal that reacts with oxygen at a relatively low temperature, and is formed to be in contact with the oxide semiconductor film 12 between the sidewalls 16T and 16C.

Figure 7C:
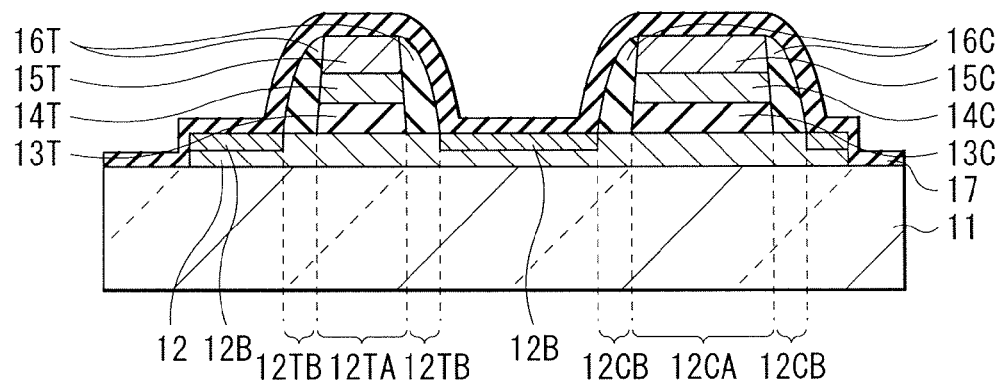
FIG. 7C is a cross-sectional view illustrating a process following FIG. 7B.

Subsequently, as illustrated in FIG. 7C, a heat treatment is performed, for example, at a temperature of about 200 degrees centigrade to oxidize the metal film 17A, thereby forming the high-resistance film 17. On this occasion, a region in which the high-resistance film 17 is in contact therewith of the oxide semiconductor film 12, namely, a position adjacent to the sidewalls 16T and 16C, is formed with a low-resistance region 12B. In other words, through the sidewalls 16T and 16C, the separation regions 12TB and 12CB are formed between the overlapping regions 12TA and 12CA and the low-resistance region 12B. The low-resistance region 12B may be provided, for example, in a part (the high-resistance film 17 side) in a thickness direction (Z direction) of the oxide semiconductor film 12. In an oxidation reaction of the metal film 17A, a part of oxygen included in the oxide semiconductor film 12 is used. Therefore, with the progress of oxidation of the metal film 17A, an oxygen concentration is reduced in the oxide semiconductor film 12 from a surface (upper surface) thereof in contact with the metal film 17A. On the other hand, a metal such as aluminum is diffused from the metal film 17A into the oxide semiconductor film 12. Such metal element functions as a dopant, and a region on the upper surface side of the oxide semiconductor film 12 in contact with the metal film 17A is reduced in resistance consequently. As a result, the low-resistance region 12B that is lower in electrical resistance than the overlapping regions 12TA and 12CA is formed in a self-alignment manner.

As the heat treatment of the metal film 17A, annealing may be preferably performed at a temperature of about 200 degrees centigrade as described above. On the occasion, the annealing may be performed under an oxidative gas atmosphere including oxygen, etc. Thereby, an oxygen concentration in the low-resistance region 12B is prevented from being excessively reduced and sufficient oxygen is supplied to the oxide semiconductor film 12. As a result, an annealing process performed as a post-process may be omitted to thereby simplify processes.

In place of the annealing process, for example, a temperature of the substrate 11 at the time of forming the metal film 17A on the substrate 11 may be set to be relatively high to thereby form the high-resistance film 17. For example, in a process of FIG. 7B, when the metal film 17A is formed while keeping the temperature of the substrate 11 at about 200 degrees centigrade, a predetermined region of the oxide semiconductor film 12 is reduced in resistance without performing the heat treatment. In this case, it is possible to reduce a carrier concentration of the oxide semiconductor film 12 to a level necessary as a transistor.

The metal film 17A may be preferably formed at a thickness of 10 nm or less as described above. One reason is that when a thickness of the metal film 17A is 10 nm or less, the metal film 17A is completely oxidized (the high-resistance film 17 is formed) through the heat treatment. When the metal film 17A is not completely oxidized, a process of removing the unoxidized metal film 17A through etching is necessary, because a leakage current may be generated when the metal film 17A that is not sufficiently oxidized is left on the etching resistant films 15T and 15C. When the metal film 17A is completely oxidized and the high-resistance film 17 is formed, such a removal process is unnecessary to thereby simplify the manufacturing process. That is, even if the removal process is not performed through the etching, it is possible to prevent generation of the leakage current. When the metal film 17A is formed at a thickness of 10 nm or less, a thickness of the high-resistance film 17 after the heat treatment is about 20 nm or less.

As a method of oxidizing the metal film 17A, a method of performing oxidation in a vapor atmosphere or plasma oxidation may be used besides the above-described heat treatment. In particular, the plasma oxidation is advantageous in that, when forming the inter-layer insulating film 18 using the plasma CVD method after the formation of the high-resistance film 17, it is possible to form the inter-layer insulating film 18 subsequently (continuously) after the plasma oxidation treatment is applied to the metal film 17A. Therefore, it is advantageous in that it is unnecessary to increase the number of processes. The plasma oxidation may be desirably performed under the conditions in which a temperature of the substrate 11 is set in a range from about 200 degrees centigrade to about 400 degrees centigrade and plasma may be generated under an atmosphere of gas containing oxygen, such as a mixed gas of oxygen and oxygen dinitride. Thereby, the high-resistance film 17 having a preferable barrier property to the outside air as described above is formed.

After the high-resistance film 17 is formed, the inter-layer insulating film 18 is formed over the entire surface of the high-resistance film 17. In the case where the inter-layer insulating film 18 includes an inorganic insulating material, for example, the plasma CVD method, the sputtering method, or the atomic layer deposition method may be used. In the case where the inter-layer insulating film 18 includes an organic insulating material, for example, a coating method such as a spin coating method and a slit coating method may be used. By using the coating method, the inter-layer insulating film 18 having an increased thickness is easily formed. When the inter-layer insulating film 18 is made of aluminum oxide, the reactive sputtering method may be used in which a DC or AC power supply is used and aluminum is used as a target. After the inter-layer insulating film 18 is provided, the photolithography method and the etching method are performed to form the connection holes H1 in predetermined locations of the inter-layer insulating film 18 and the high-resistance film 17.

Then, a conductive film (not illustrated) made of a constituent material of the above-described source-drain electrodes 19 may be formed on the inter-layer insulating film 18, for example, by using the sputtering method. Further, the connection holes H1 are embedded by the conductive film. Thereafter, the conductive film may be patterned in a predetermined shape, for example, by using the photolithography method and the etching method. Thereby, the source-drain electrodes 19 are formed on the inter-layer insulating film 18, and are connected to the low-resistance region 12B of the oxide semiconductor film 12. Through the above-described processes, the transistor 10T and the capacitor 10C are formed on the substrate 11.

(Process of Forming Planarizing Film 21)

Next, the planarizing film 21 made of the above-described material may be so formed, for example, by using the spin coating method or the slit coating method, as to cover the inter-layer insulating film 18 and the source-drain electrodes 19. Further, the connection hole H2 is formed at a part of a region facing the source-drain electrodes 19.

(Process of Forming Organic EL Element 20)

Subsequently, the organic EL element 20 is formed on the planarizing film 21. Specifically, a film of the first electrode 22 made of the above-described material is so formed on the planarizing film 21, for example, by using the sputtering method, as to embed the connection hole H2. Then, the first electrode 22 is patterned by using the photolithography method and the etching method. Thereafter, after the pixel separation film 23 having the opening is formed on the first electrode 22, a film of the organic layer 24 may be formed, for example, by using a vacuum evaporation method. Then, the second electrode 25 made of the above-described material may be formed on the organic layer 24, for example, by using the sputtering method. Subsequently, after a film of the protective layer 26 is formed on the second electrode 25, for example, by using the CVD method, the sealing substrate 28 is adhered to the protective layer 26 by using the adhesion layer 27. As described above, the display unit 1 illustrated in FIG. 1 is completed.

In the display unit 1, when a drive current according to an image signal of each color is applied, for example, to each pixel PXLC corresponding to any of R, G, and B, electrons and holes are injected into the organic layer 24 through the first electrode 22 and the second electrode 25. These electrons and holes are each recombined in the organic EL layer included in the organic layer 24 to thereby generate light. In this manner, for example, a full-color image display of R, G, and B is performed in the display unit 1. Further, on the occasion of the image display operation, a potential corresponding to the image signal is applied to one end of the capacitor 10C. Thereby, an electrical charge corresponding to the image signal is accumulated in the capacitor 10C.

Here, the separation region 12TB having a predetermined width is provided between the overlapping region 12TA and the low-resistance regions 12B of the oxide semiconductor film 12. Therefore, it is possible to adjust a distance between the pair of low-resistance regions 12B. Therefore, even when the overlapping region 12TA is short in length, it is possible to improve withstand voltage characteristics of the transistor 10T, description on which is described in the following.

Figure 8:
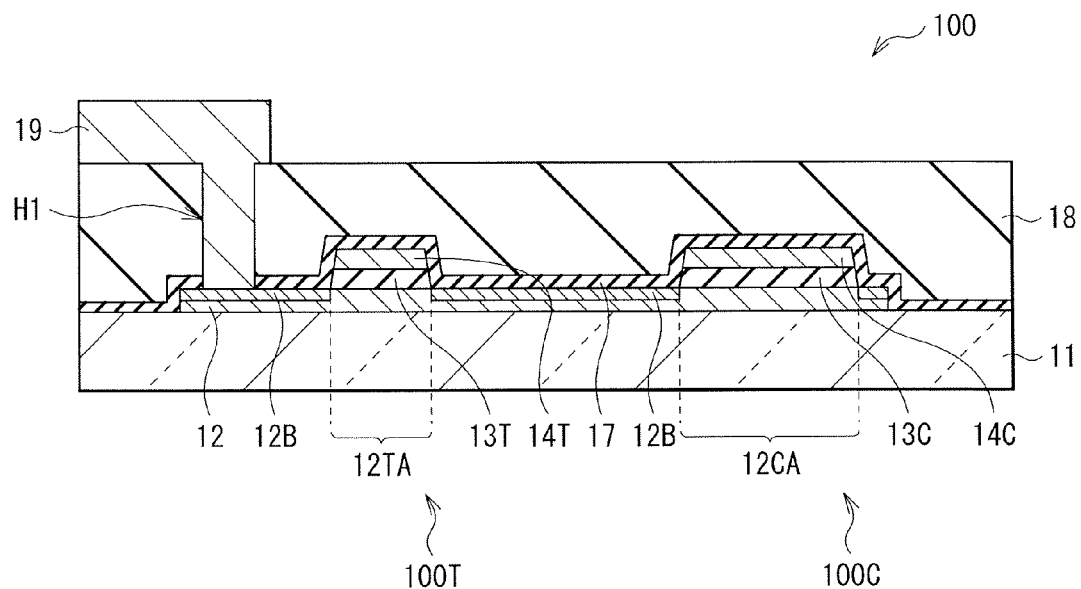
FIG. 8 is a cross-sectional view illustrating a major part of the display unit according to a comparative example.

FIG. 8 illustrates a cross-sectional configuration of a display unit (display unit 100) according to a comparative example. The display unit 100 includes a transistor 100T having a self-aligned structure as a drive element. The oxide semiconductor film 12 is provided with the low-resistance region 12B. In the oxide semiconductor film 12, the low-resistance regions 12B and the overlapping region 12TA that is overlapped with the gate electrode 14T are adjacent to each other, and the separation region is not provided therebetween. In the transistor 100T having the self-aligned structure, since it is possible to make the overlapping region 12TA (channel length) short easily, the display unit 100 is allowed to display an image of high definition. In particular, in the case where a capacitor 100C is formed on the substrate 11 together with the transistor 100T, it is possible to make the channel length of the transistor 100T shorter. However, the transistor 100T having a short channel length is low in voltage resistance, and is easily deteriorated. In particular, in the organic EL display unit having a common organic layer among pixels, a high voltage is applied. Therefore, there is a possibility that an image quality of the display unit 100 is reduced.

In contrast, in the display unit 1, the sidewalls 16T are provided to form the separation regions 12TB between the overlapping region 12TA and the low-resistance regions 12B. Therefore, the distance between the pair of low-resistance regions 12B is extended by lengths of the pair of separation regions 12TB. Accordingly, it is possible to control the lengths of the separation regions 12TB, namely, widths of the sidewalls 16T, and thereby to improve withstand voltage characteristics of the transistor 10T.

As described above, in the present embodiment, the separation regions 12TB are provided between the overlapping region 12TA and the low-resistance regions 12B of the oxide semiconductor film 12. Thus, even when the overlapping region 12TA is made short, it is possible to improve withstand voltage characteristics of the transistor 10T. Therefore, it is possible for the display unit 1 to display a high-quality image having high definition and uniform luminance, and to address demands for a larger screen and a higher frame rate.

Further, since the capacitor 10C is formed together the transistor 10T having the self-aligned structure, it is possible to make the overlapping region 12TC short. That is, in the display unit 1, it is possible to make the area of the capacitor 10C small, and to manufacture the display unit 1 with reduced defect and high yield.

Hereinafter, a modification example of the present embodiment and the some other embodiments are described. In the following description, the same components as those of the embodiments are denoted with the same reference numerals, and the description thereof is omitted where appropriate.

Modification Example

Figure 9:
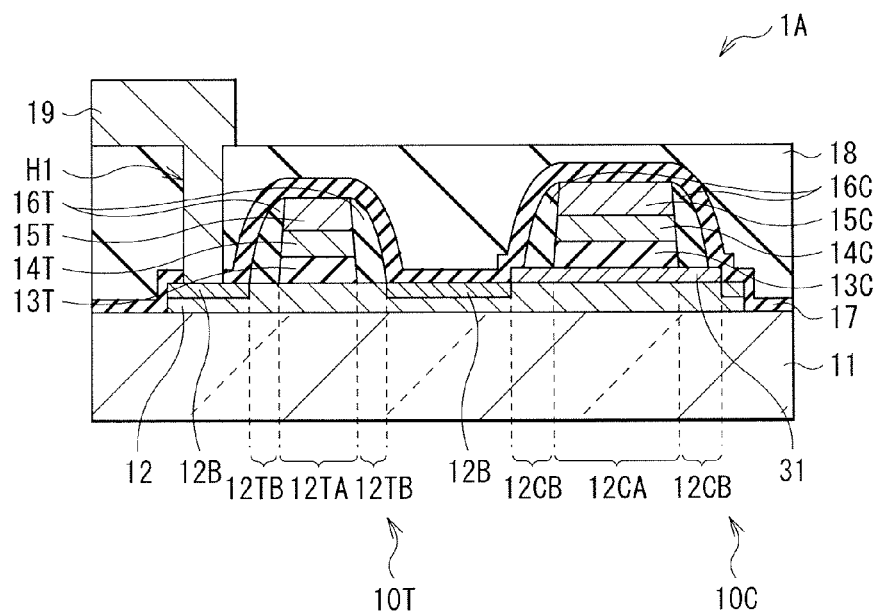
FIG. 9 is a cross-sectional view illustrating a configuration of the display unit according to a modification example.

FIG. 9 illustrates cross-sectional configurations of the transistor 10T and the capacitor 10C of a display unit (display unit 1A) according to a modification example of the first embodiment. The display unit 1A has the same configuration as that of the display unit 1 of the above-described embodiment, and has the same function and effect as those of the display unit 1, with the exception that, in the display unit 1A, a conductive film 31 is provided between the oxide semiconductor film 12 and the capacitor insulating film 13C of the capacitor 10C.

The conductive film 31 may be made of a metal material such as titanium, molybdenum, or aluminum, and is provided over a region wider than respective regions of the capacitor insulating film 13C and the capacitor electrode 14C in plain view. The conductive film 31 may have a configuration in which a plurality of metal films are laminated. Providing the conductive film 31 makes it possible to eliminate applied voltage dependency of a capacitance value and to secure a sufficient capacitance regardless of a size of a bias voltage. That is, a display characteristic of the display unit 1A is improved.

Figure 10A:
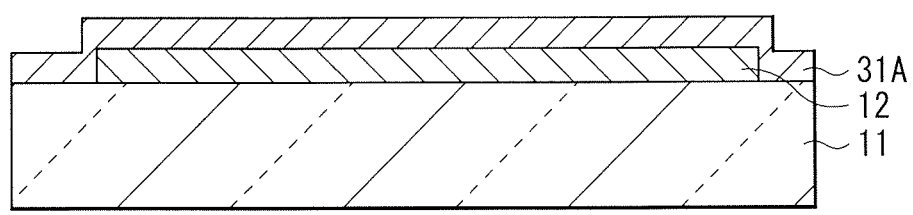
FIG. 10A is a cross-sectional view illustrating a method of manufacturing the display unit illustrated in FIG. 9.
Figure 10B:
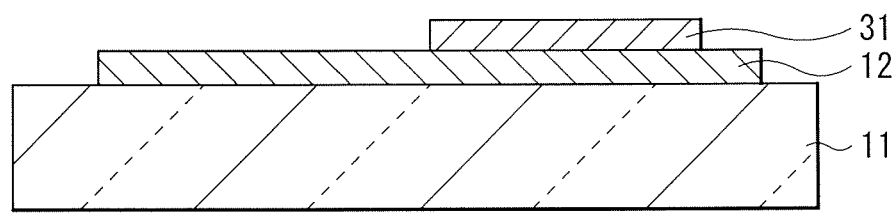
FIG. 10B is a cross-sectional view illustrating a process following FIG. 10A.

The conductive film 31 of the holding capacitor 10C may be formed, for example, as follows. First, after the oxide semiconductor film 12 is provided on the substrate 11, a conductive film 31A is formed at a thickness of 50 nm over the entire surface of the substrate 11, for example, by using the sputtering method (FIG. 10A). Thereafter, the conductive film 31A is patterned by using the photolithography method and the etching method to form the conductive film 31 in a desired position (FIG. 10B). For example, in wet-etching the conductive film 31A which may be made of molybdenum or aluminum using a mixed liquid of a phosphoric acid, a nitric acid, and an acetic acid, the oxide semiconductor film 12 may be preferably configured by a crystalline indium gallium oxide (IGO), indium zinc oxide (IZO) or the like, or by amorphous indium tin zinc oxide (ITZO). One reason is that such oxide semiconductor film 12 is difficult to be etched by the mixed liquid of the phosphoric acid, the nitric acid, and the acetic acid. When an indium gallium zinc oxide (IGZO) is used for the oxide semiconductor film 12, the conductive film 31A may be processed by dry etching. In this case, for example, titanium, molybdenum, and aluminum may be used for the conductive film 31A.

Second Embodiment

Figure 11:
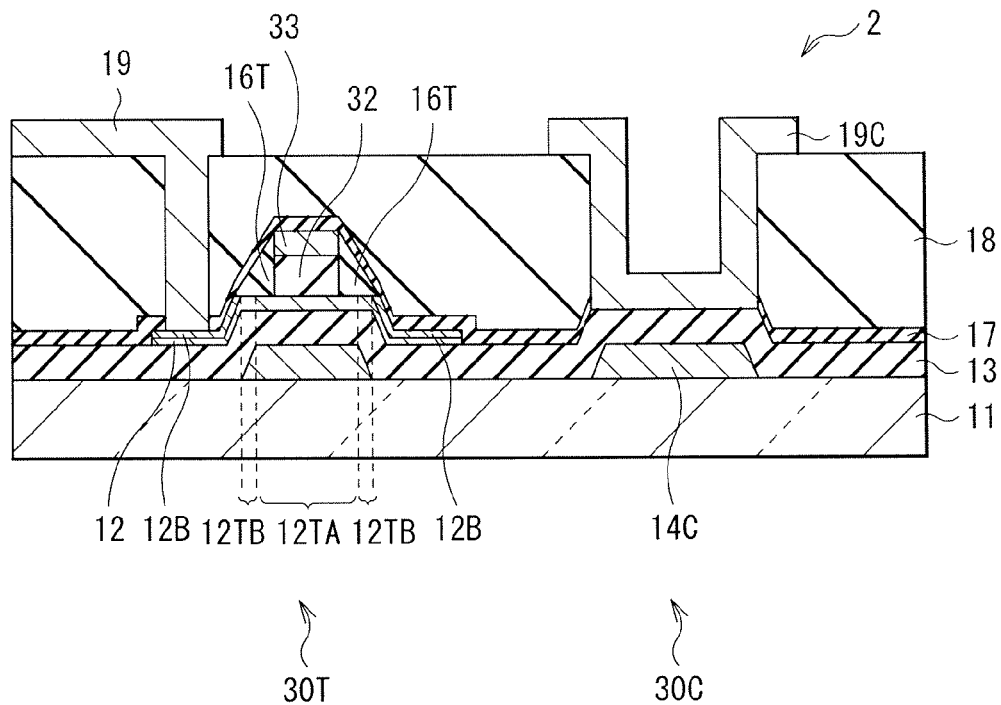
FIG. 11 is a cross-sectional view illustrating a configuration of a display unit according to a second embodiment of the present application.

FIG. 11 illustrates a cross-sectional configuration of a major part of a display unit (display unit 2) according to a second embodiment of the present application. The display unit 2 has the same configuration as that of the display unit 1 of the first embodiment, and has the same function and effect as those of the display unit 1, with the exception that the display unit 2 has a bottom gate type transistor (transistor 30T) and a capacitor 30C.

The transistor 30T has the gate electrode 14T, the insulating film 13, the oxide semiconductor film 12, a channel protective film 32, and an etching resistant film 33 in this order on the substrate 11. The channel protective film 32 may be configured by an insulating film such as a silicon oxide film. The etching resistant film 33 may be configured by a material that shows etching resistance higher than that of the channel protective film 32 under predetermined conditions, such as an oxide including ITO, IZO, and IGZO. The channel protective film 32 and the etching resistant film 33 are provided at a position facing the gate electrode 14T. The sidewalls 16T cover side surfaces of the channel protective film 32 and the etching resistant film 33. The sidewalls 16T form the separation regions 12TB between the overlapping region 12TA and the low-resistance regions 12B of the oxide semiconductor film 12. The separation regions 12TB improve withstand voltage characteristics of the transistor 30T.

The capacitor 30C has the insulating film 13 that is shared with the transistor 30T between a pair of capacitor electrodes (capacitor electrodes 14C and 19C). The capacitor electrodes 14C and 19C are provided, for example, on the same layers as those of the gate electrode 14T and the source-drain electrodes 19, respectively.

Figure 12:
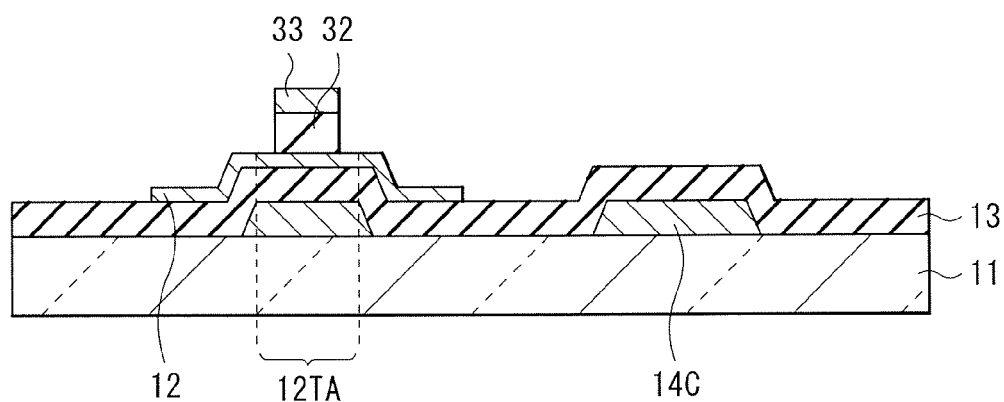
FIG. 12 is a cross-sectional view illustrating a method of manufacturing the display unit illustrated in FIG. 11.

The transistor 30T may be formed, for example, as follows. First, after the gate electrode 14T, the insulating film 13, and the oxide semiconductor film 12 are provided in this order on the substrate 11, the channel protective film 32 is formed through backside exposure using the gate electrode 14T as a mask. Using such backside exposure reduces a displacement between the channel protective film 32 and the gate electrode 14T to allow the channel protective film 32 to be formed over the gate electrode 14T. Subsequently, the etching resistant film 33 is formed on the channel protective film 32 (FIG. 12). Then, an insulating film such as a silicon oxide film or a silicon nitride film is formed over the entire surface of the substrate 11, and dry etching is performed on the substrate 11 as a whole using gas containing fluorine. Thereby, the etching resistant film 33 functions as an etching stopper and the sidewalls 16T are formed. Thereafter, the high-resistance film 17, the inter-layer insulating film 18, and the source-drain electrodes 19 are formed in this order in the same manner as the transistor 10T to complete the transistor 30T. As described above, in the bottom gate type transistor 30T, the etching resistant film 33 is provided on the channel protective film 32. Thereby, the sidewalls 16T are formed on side surfaces of the channel protective film 32 and the etching resistant film 33.

Third Embodiment

Figure 13:
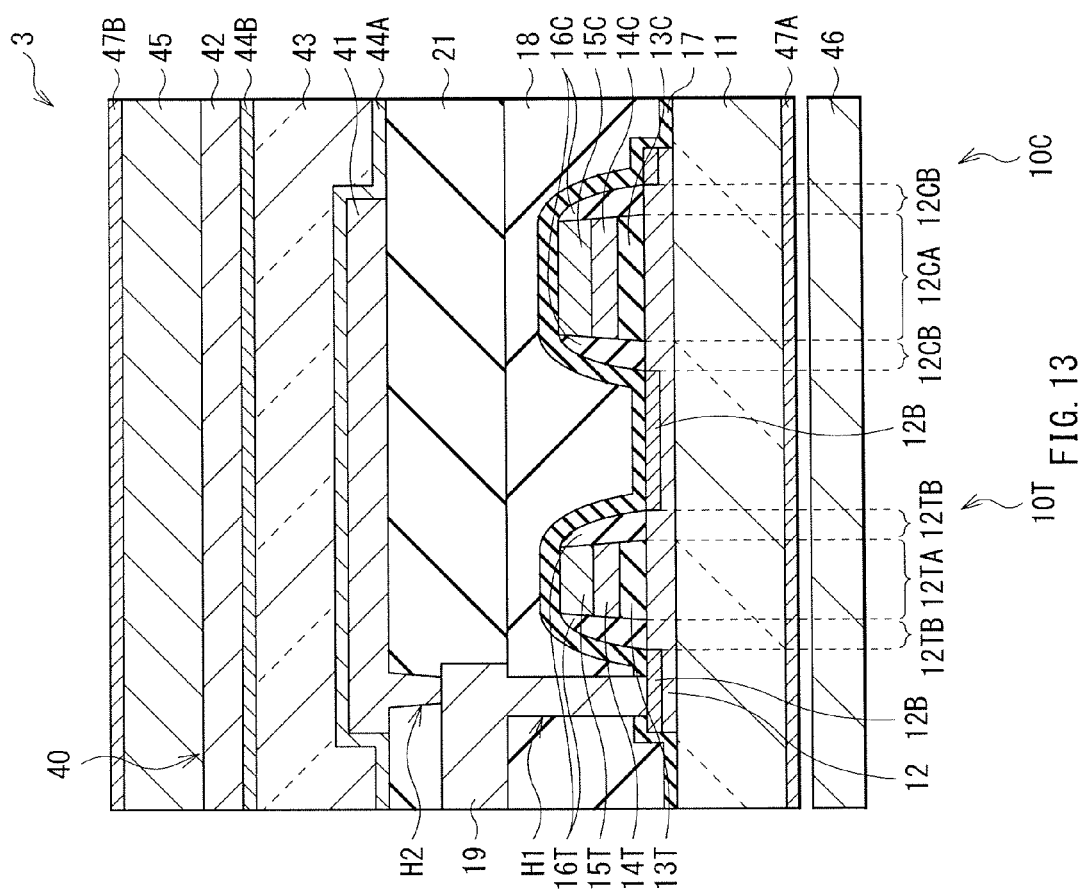
FIG. 13 is a cross-sectional view illustrating a configuration of a display unit according to a third embodiment of the present application.

FIG. 13 illustrates a cross-sectional configuration of a display unit (display unit 3) according to a third embodiment of the present application. The display unit 3 has the same configuration as that of the display unit 1 of the above-described embodiment, and has the same function and effect as those of the display unit 1, with the exception that the display unit 3 has a liquid crystal display elements 40 in place of the organic EL element 20 of the first embodiment (display unit 1).

The display unit 3 has the same transistor 10T and capacitor 10C as those of the display unit 1. Further, the liquid crystal display element 40 is provided at an upper layer of the transistor 10T and the capacitor 10C with the planarizing film 21 interposed in between.

The liquid crystal display element 40 may have a configuration in which, for example, a liquid crystal layer 43 is sealed between a pixel electrode 41 and a counter electrode 42. Respective surfaces on the liquid crystal layer 43 side of the pixel electrode 41 and the counter electrode 42 are provided with alignment films 44A and 44B. The pixel electrode 41 is provided for each pixel, and may be, for example, electrically connected to the source-drain electrodes 19 of the transistor 10T. The counter electrode 42 is provided on a counter substrate 45 as an electrode common to the plurality of pixels, and may be held, for example, at a common potential. The liquid crystal layer 43 may be configured, for example, by liquid crystals driven by a VA (Vertical Alignment) mode, a TN (Twisted Nematic) mode, an IPS (In Plane Switching) mode, or the like.

Further, a backlight 46 is provided under the substrate 11. Further, respective polarizing plates 47A and 47B are adhered to the backlight 46 side of the substrate 11 and the counter substrate 45.

The backlight 46 is a light source that emits light toward the liquid crystal layer 43, and may include, for example, a plurality of LEDs (Light Emitting Diode), CCFLs (Cold Cathode Fluorescent Lamp), or the like. A lighting state and an extinction state of the backlight 46 are controlled by a backlight drive section (not illustrated).

The polarizing plates 47A and 47B (a polarizer and an analyzer) may be mutually arranged, for example, in crossed Nicols, thereby allowing, for example, illumination light from the backlight 46 to be blocked in a non-voltage applied state (off state) and allowing the light to transmit therethrough in a voltage applied state (on state).

In the display unit 3, as in the display unit 1 of the above-described embodiment, the separation regions 12TB are provided between the overlapping region 12TA and the low-resistance regions of the oxide semiconductor film 12. As a result, also in the present embodiment, withstand voltage characteristics of the transistor 10T are improved.

Fourth Embodiment

Figure 14:
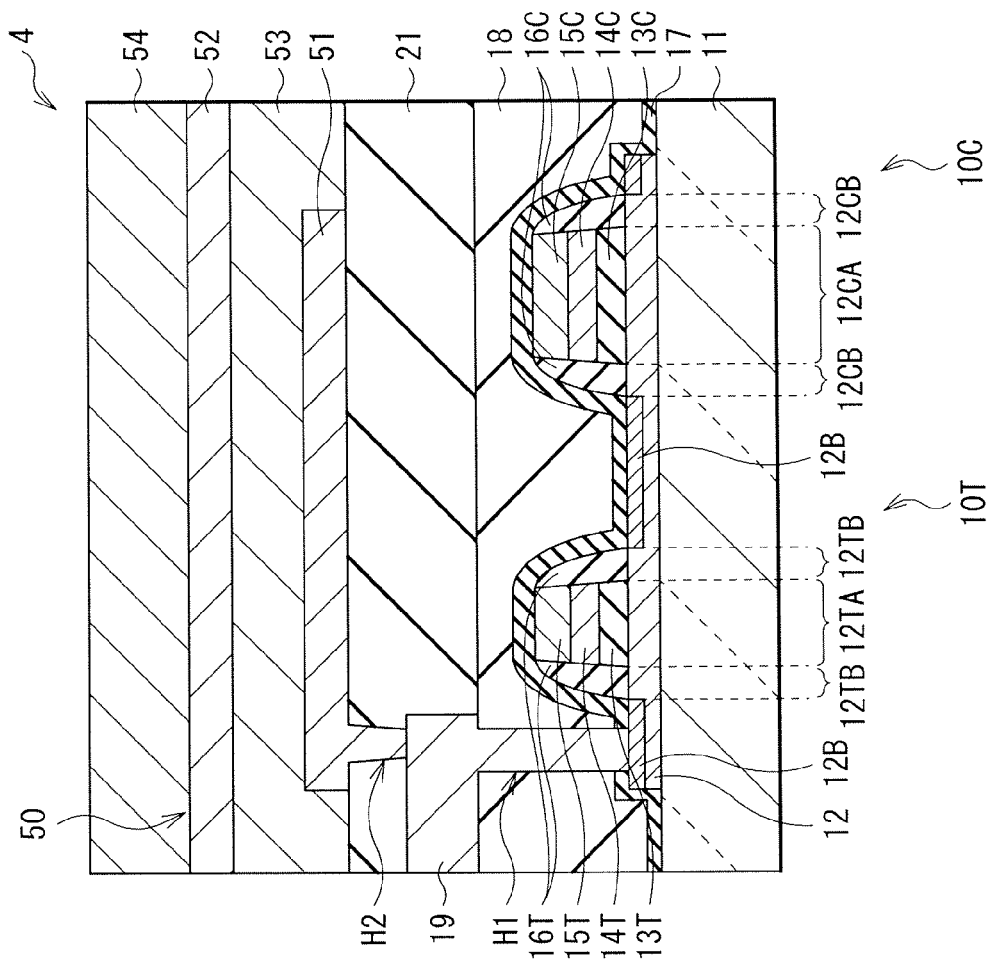
FIG. 14 is a cross-sectional view illustrating a configuration of a display unit according to a fourth embodiment of the present application.

FIG. 14 illustrates a cross-sectional configuration of a display unit (display unit 4) according to a fourth embodiment of the present application. The display unit 4 has the same configuration as that of the display unit 1 of the above-described embodiment, and has the same function and effect as those of the display unit 1, with the exception that the display unit 4 is a so-called electronic paper, and has an electrophoretic display device 50 in place of the organic EL element 20 of the display unit 1.

The display unit 4 has the same transistor 10T and capacitor 10C as those of the display unit 1. The electrophoretic display device 50 is provided on an upper layer of the transistor 10T and the capacitor 10C with the planarizing film 21 interposed in between.

The electrophoretic display device 50 may have a configuration in which, for example, a display layer 53 including an electrophoretic display element is sealed between a pixel electrode 51 and a common electrode 52. The pixel electrode 51 is provided for each pixel, and may be, for example, electrically connected to the source-drain electrodes 19 of the transistor 10T. The common electrode 52 is provided on the counter substrate 54 as an electrode common to a plurality of pixels.

In the display unit 4, as in the display unit 1 of the above-described embodiment, the separation regions 12TB are provided between the overlapping region 12TA and the low-resistance regions 12B of the oxide semiconductor film 12. As a result, also in the present embodiment, withstand voltage characteristics of the transistor 10T are improved.

Application Examples

Hereinafter, some application examples to electronic apparatus of any of the display units (any of the display units 1, 1A, 2, 3, and 4) described above are described. Examples of the electronic apparatus may include a television set, a digital camera, a notebook personal computer, a portable terminal device such as a mobile phone, and a video camera. In other words, any of the display units described above is applicable to an electronic apparatus in any field, which displays, as an image or a picture, an image signal input from the outside or an image signal generated in the inside.

(Module)

Figure 15:
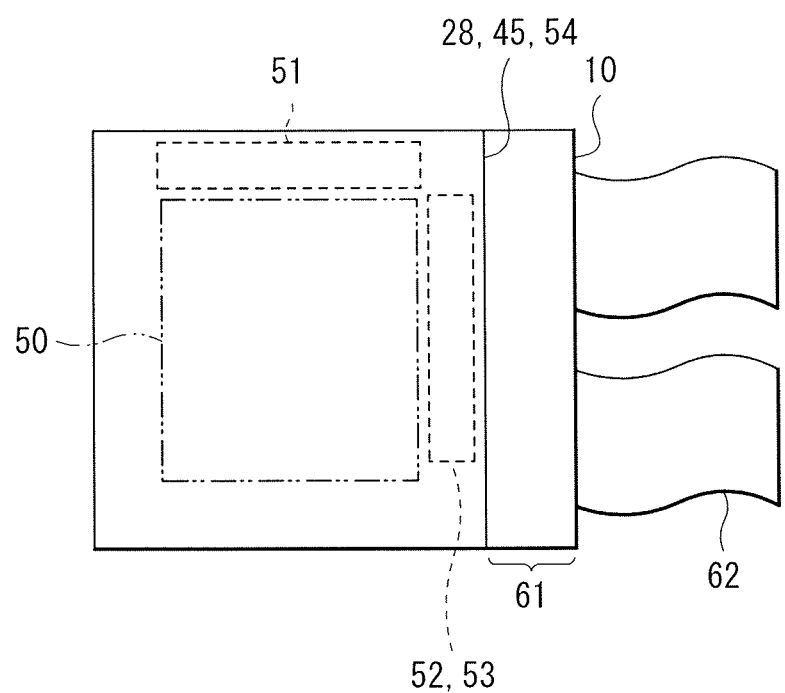

As a module as illustrated in FIG. 15, for example, any of the display units described above may be integrated into various sorts of electronic apparatus, such as those of application examples 1 to 7 to be hereinafter described. In this module, for example, a region 61 exposed from the sealing substrate 28 or the counter substrates 45 and 54 may be provided on one side of the substrate 11. Further, wirings of the horizontal selector 51, the write scanner 52, and the power supply scanner 53 may be provided to extend to the exposed region 61 to form an external connection terminal (not illustrated). The external connection terminal may be provided with FPC (Flexible Printed Circuit) 62 for inputting and outputting signals.

Application Example 1

Figure 16A:
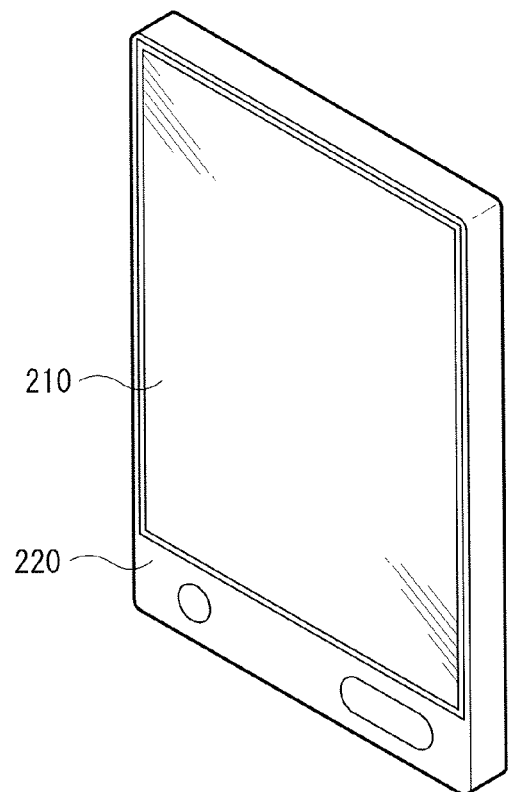
Figure 16B:
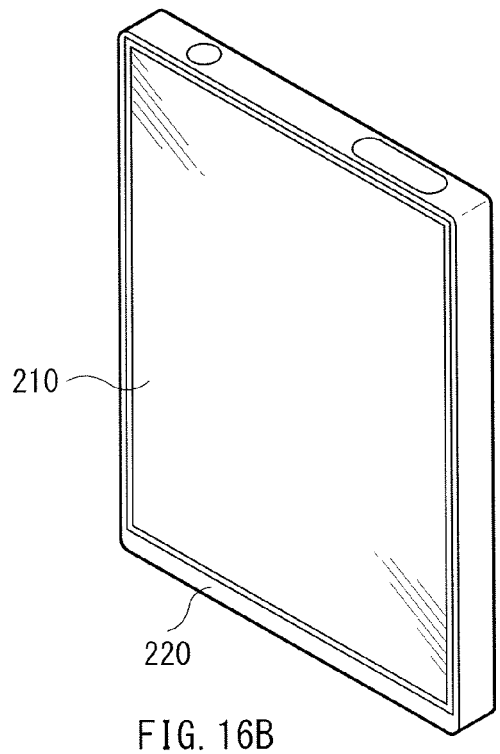
FIG. 16B is a perspective view illustrating another example of an appearance of the application example 1 illustrated in FIG. 16A.

FIGS. 16A and 16B each illustrate an appearance of an electronic book to which the display unit according to any of the embodiments described above is applied. The electronic book may have, for example, a display section 210 and a non-display section 220, and the display section 210 may be configured by the display unit according to any of the embodiments described above.

Application Example 2

Figure 17:
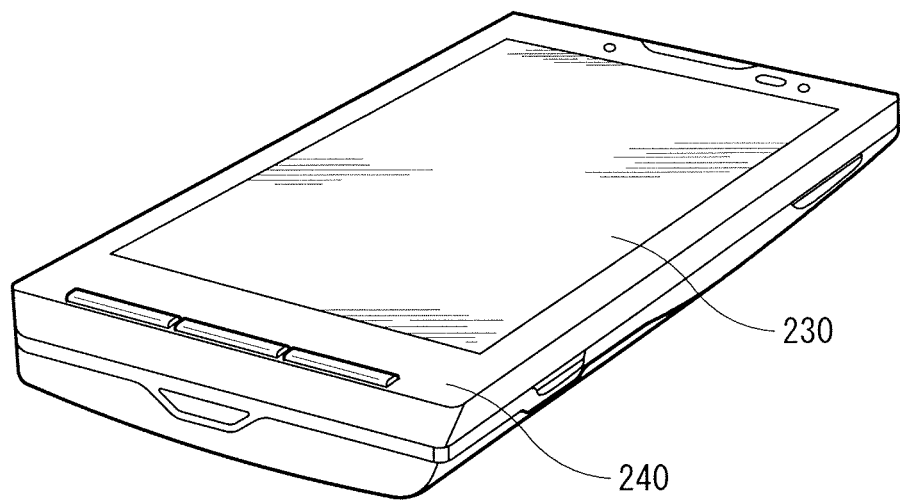
FIG. 17 is a perspective view illustrating an appearance of an application example 2.

FIG. 17 illustrates an appearance of a smartphone to which the display unit according to any of the embodiments described above is applied. The smartphone may have, for example, a display section 230 and a non-display section 240, and the display section 230 may be configured by the display unit according to any of the embodiments described above.

Application Example 3

Figure 18:
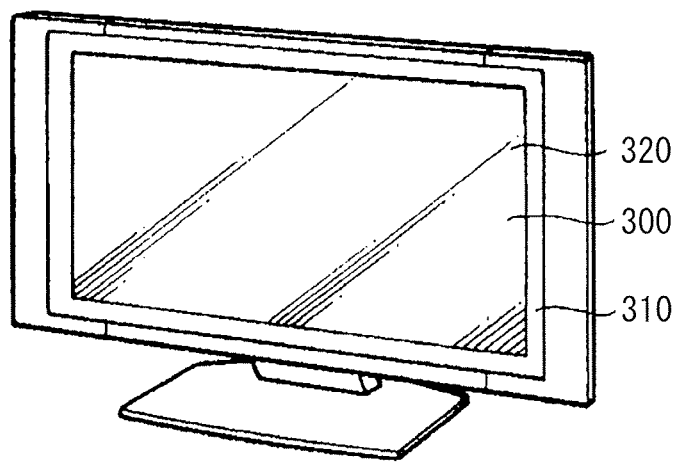
FIG. 18 is a perspective view illustrating an appearance of an application example 3.

FIG. 18 illustrates an appearance of a television set to which the display unit according to any of the embodiments described above is applied. The television set may have, for example, an image display screen section 300 including a front panel 310 and a filter glass 320, and the image display screen section 300 may be configured by the display unit according to any of the embodiments described above.

Application Example 4

Figure 19A:
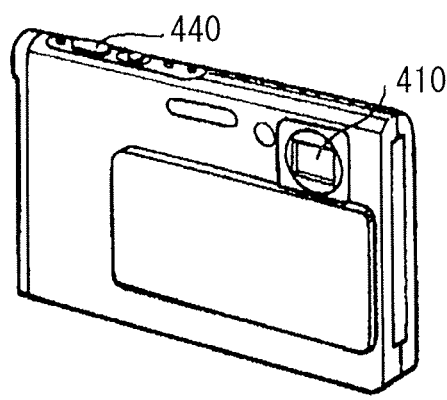
FIG. 19A is a perspective view illustrating an appearance viewed as from a front side of an application example 4.
Figure 19B:
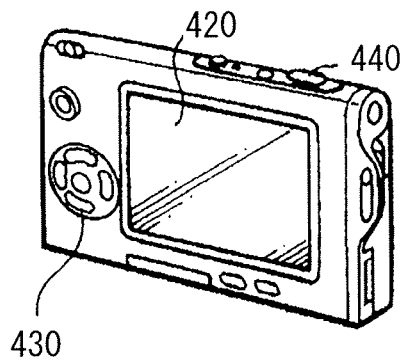
FIG. 19B is a perspective view illustrating an appearance viewed as from a rear side of the application example 4.

FIGS. 19A and 19B each illustrate an appearance of a digital camera to which the display unit according to any of the embodiments described above is applied. The digital camera may have, for example, a flash light emitting section 410, a display section 420, a menu switch 430, and a shutter button 440, and the display section 420 may be configured by the display unit according to any of the embodiments described above.

Application Example 5

Figure 20:
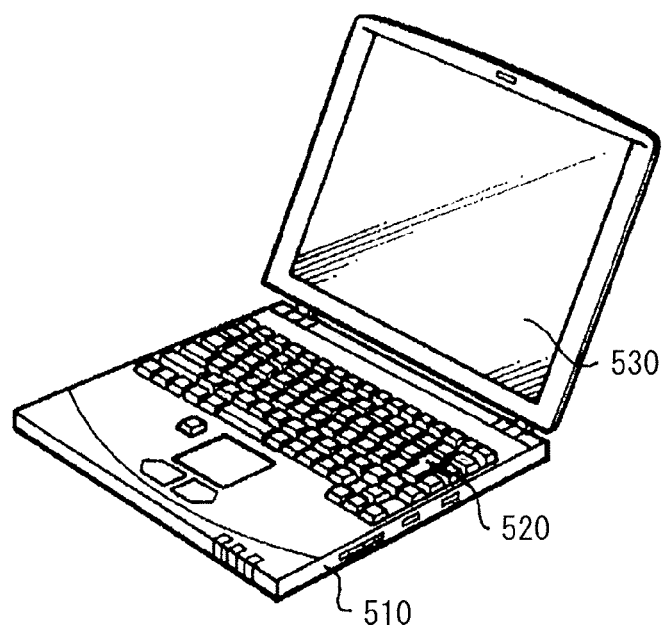
FIG. 20 is a perspective view illustrating an appearance of an application example 5.

FIG. 20 illustrates an appearance of a notebook personal computer to which the display unit according to any of the embodiments described above is applied. The notebook personal computer may have, for example, a main body 510, a keyboard 520 for an input operation of characters, etc., and a display section 530 that displays an image, and the display section 530 may be configured by the display unit according to any of the embodiments described above.

Application Example 6

Figure 21:
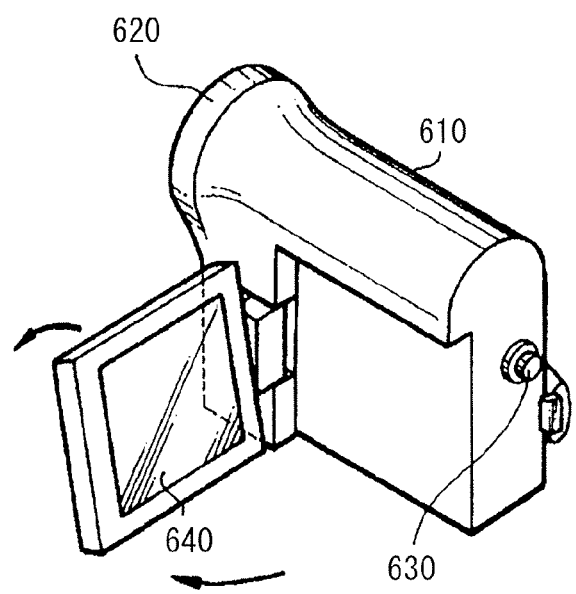
FIG. 21 is a perspective view illustrating an appearance of an application example 6.

FIG. 21 illustrates an appearance of a video camera to which the display unit according to any of the embodiments described above is applied. The video camera may have, for example, a main body section 610, a lens 620 for shooting an object provided on a front side face of the main body section 610, a start/stop switch 630 during shooting, and a display section 640. The display section 640 may be configured by the display unit according to any of the embodiments described above.

Application Example 7

Figure 22A:
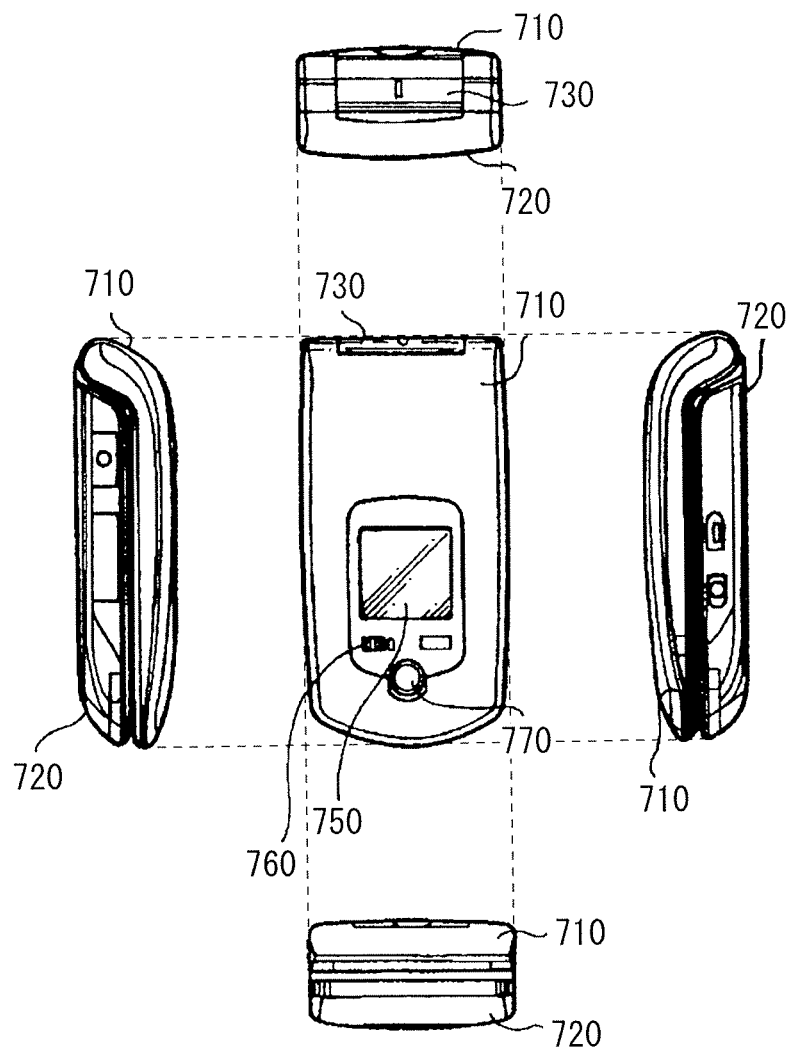
FIG. 22A illustrates a closed state of an application example 7.
Figure 22B:
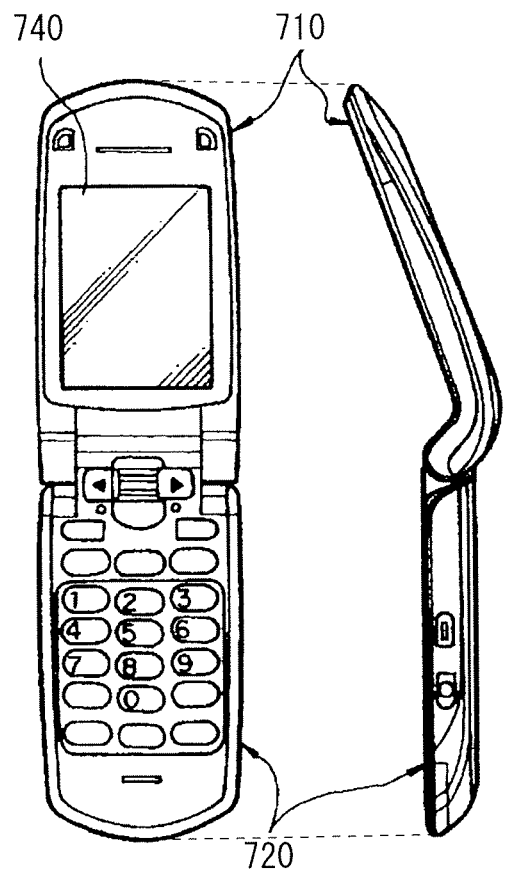
FIG. 22B illustrates an opened state of the application example 7.

FIGS. 22A and 22B each illustrate an appearance of a mobile phone to which the display unit according to any of the embodiments described above is applied. The mobile phone has a configuration in which, for example, an upper body 710 and a lower body 720 are connected through a connection section (hinge part) 730, and may have a display 740, a sub-display 750, a picture light 760, and a camera 770. The display 740 or the sub-display 750 may be configured by the display unit according to any of the embodiments described above.

As described above, the present application is described with reference to the example embodiments and the modification examples. However, the present application is not limited to the embodiments and the like, and may be variously modified. For example, in the embodiments and the like, a structure in which the high-resistance film 17 is provided is described as an example. However, the high-resistance film 17 may be removed after the low-resistance region 12B is formed. Note that, as described above, a case where the high-resistance film 17 is provided may be desirable since electrical characteristics of the transistor 10T and the holding capacitor 10C are held in a stable manner.

Further, in the embodiments and the like, a case where the low-resistance region 12B is provided partially in the oxide semiconductor film 12 in a thickness direction from a surface (upper surface) thereof is described. However, the low-resistance region 12B may be provided entirely in the oxide semiconductor film 12 in the thickness direction from the surface (upper surface) thereof.

Further, materials and thicknesses of respective layers or film formation methods and film formation conditions described in the embodiments and the like are not limited. Other materials and thicknesses may be used, or other film formation methods and film formation conditions may be used.

In addition, in the embodiments and the like, configurations of the organic EL element 20, the liquid crystal display element 40, the electrophoretic display device 50, the transistors 10T and 30T, and the holding capacitors 10C and 30C are specifically described. However, it is unnecessary to include all of the layers, or any other layers may be further included.

Further, the present application is applicable also to a display unit using any other display elements such as inorganic electroluminescence elements, besides the organic EL element 20, the liquid crystal display element 40, and the electrophoretic display device 50.

In addition, for example, configurations of the display units of the embodiments are specifically described. However, it is unnecessary to include all of the components, or any other components may be further included.

Further, in the embodiments and the like, the display unit has been described as an example of a semiconductor device that includes the transistors 10T and 30T and the holding capacitors 10C and 30C. However, the semiconductor device may be applied to an image detector or any other suitable apparatus.

Furthermore, the technology encompasses any possible combination of some or all of the various embodiments described herein and incorporated herein.

It is possible to achieve at least the following configurations from the above-described example embodiments of the disclosure.

(1) A semiconductor device including
 a transistor, wherein the transistor includes
 a gate electrode,
 an oxide semiconductor film facing the gate electrode and including a first overlapping region that is overlapped with the gate electrode,
 a low-resistance region provided in the oxide semiconductor film, and
 a first separation region provided between the low-resistance region and the first overlapping region.

(2) The semiconductor device according to (1), further including:
 a gate insulating film provided between the gate electrode and the oxide semiconductor film; and
 a first sidewall provided on a side surface of the gate electrode and on a side surface of the gate insulating film, and in contact with the first separation region of the oxide semiconductor film.

(3) The semiconductor device according to (2), further including a first etching resistant film provided on a surface opposite to the gate insulating film of the gate electrode.

(4) The semiconductor device according to (3), wherein the first etching resistant film has etching resistance to dry etching higher than the etching resistance of the gate electrode.

(5) The semiconductor device according to (3) or (4), wherein the first etching resistant film has a planar shape that is same as a planar shape of the gate electrode.

(6) The semiconductor device according to any one of (3) to (5), wherein the first etching resistant film includes an oxide.

(7) The semiconductor device according to any one of (3) to (6), wherein the first etching resistant film includes one of an indium tin oxide, an indium zinc oxide, and an indium gallium zinc oxide.

(8) The semiconductor device according to any one of (1) to (7), wherein the gate electrode includes titanium, aluminum or copper, and molybdenum or molybdenum nitride.

(9) The semiconductor device according to (2), wherein the first sidewall includes one or more of a silicon oxide, a silicon oxynitride, and a silicon nitride.

(10) The semiconductor device according to (1), further including:
 a channel protective film that covers the first overlapping region of the oxide semiconductor film; and
 a second sidewall that covers a side surface of the channel protective film.

(11) The semiconductor device according to (10), further including a second etching resistant film provided on a surface opposite to the oxide semiconductor film of the channel protective film.

(12) The semiconductor device according to any one of (1) to (11), further including a high-resistance film that is in contact with the low-resistance region.

(13) The semiconductor device according to any one of (1) to (12), wherein the low-resistance region includes a pair of low-resistance regions that are provided with the first overlapping region interposed in between.

(14) The semiconductor device according to any one of (1) to (9), further including a capacitor that shares the oxide semiconductor film of the transistor.

(15) The semiconductor device according to (14), further including a third side wall,
 wherein the capacitor includes:
 a capacitor insulating film;
 a first electrode that faces the oxide semiconductor film with the capacitor insulating film interposed in between; and
 a second separation region provided between the low-resistance region and a second overlapping region of the oxide semiconductor film, the second overlapping region being overlapped with the first electrode, and
 wherein the third sidewall is provided on a side surface of the first electrode and on a side surface of the capacitor insulating film, and is in contact with the second separation region.

(16) The semiconductor device according to (15), wherein
 the first electrode of the capacitor is provided in a same layer as the gate electrode, and the capacitor insulating film is provided in a same layer as the gate insulating film, and
 the oxide semiconductor film serves as a second electrode of the capacitor.

(17) The semiconductor device according to (15), wherein the capacitor includes a conductive film provided between the oxide semiconductor film and the capacitor insulating film.

(18) A display unit provided with a display element and a transistor configured to drive the display element, the transistor including:
 a gate electrode;
 an oxide semiconductor film facing the gate electrode and including a first overlapping region that is overlapped with the gate electrode;
 a low-resistance region provided in the oxide semiconductor film; and
 a first separation region provided between the low-resistance region and the first overlapping region.

(19) The display unit according to (18), wherein the display element is an organic electroluminescence element.

(20) An electronic apparatus provided with a display, the display being provided with a display element and a transistor configured to drive the display element, the transistor including:
 a gate electrode;
 an oxide semiconductor film facing the gate electrode and including a first overlapping region that is overlapped with the gate electrode;
 a low-resistance region provided in the oxide semiconductor film; and
 a first separation region provided between the low-resistance region and the first overlapping region.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A semiconductor device comprising
a transistor including
a gate electrode,
an oxide semiconductor film facing the gate electrode and including
a first overlapping region that is overlapped with, and has a shape and size corresponding with the gate electrode in plan view,
a first separation region provided outside of the first overlapping region in plan view, and
a low resistance region provided outside the first separation region in plan view, such that the low resistance region is absent in both the first overlapping region and the first separation region in plan view,
a gate insulating film provided between the gate electrode and the oxide semiconductor film,
a first etching resistant film provided on a surface opposite to the gate insulating film of the gate electrode, the first etching resistant film having a width in a cross sectional view that is the same as a width of the gate electrode in a cross sectional view and including one of indium tin oxide, indium zinc oxide, and indium gallium zinc oxide, and
a first sidewall covering a side surface of the gate insulating film, and formed in contact with the first separation region; and
a capacitor that shares the oxide semiconductor film of transistor, the capacitor including
the oxide semiconductor film,
a capacitor insulating film, and
a first electrode that faces the oxide semiconductor film with the capacitor insulating film interposed in between,
the oxide semiconductor film further including
a second overlapping region that is overlapped with, and has a shape and size corresponding with the first electrode in plan view, and
a second separation region provided outside of the second overlapping region in plan view, and
the low resistance region is provided outside the second separation region in plan view, such that the low resistance region is absent in both the second overlapping region and the second separation region in plan view, and
a second sidewall provided on a side surface of the first electrode and on a side surface of the capacitor insulating film, and is in contact with the second separation region,
wherein the low resistance region extends between the transistor and capacitor to connect the first and second separation regions.

2. The semiconductor device according to claim 1, wherein the gate electrode includes one of titanium, aluminum or copper, and one of either molybdenum or molybdenum nitride.

3. The semiconductor device according to claim 1, wherein the first sidewall includes one or more of a silicon oxide, a silicon oxynitride, and a silicon nitride.

4. The semiconductor device according to claim 1, further comprising:
a channel protective film that covers the first overlapping region of the oxide semiconductor film.

5. The semiconductor device according to claim 4, further comprising a second etching resistant film provided on a surface opposite to the oxide semiconductor film of the channel protective film.

6. The semiconductor device according to claim 1, further comprising a high-resistance film that is in contact with the low-resistance region.

7. The semiconductor device according to claim 1, wherein the low-resistance region comprises a first pair of low-resistance regions that are provided with the first overlapping region interposed in between, and a second pair of low-resistance regions that are provided with the second overlapping region interposed in between.

8. The semiconductor device according to claim 1, wherein the first electrode of the capacitor is provided in a same layer as the gate electrode, and the capacitor insulating film is provided in a same layer as the gate insulating film, and
the oxide semiconductor film serves as a second electrode of the capacitor.

9. The semiconductor device according to claim 1, wherein the capacitor includes a conductive film provided between the oxide semiconductor film and the capacitor insulating film.

10. A display unit provided with a display element, a capacitor, and a transistor configured to drive the display element, the transistor comprising:
a gate electrode;
an oxide semiconductor film facing the gate electrode and including
a first overlapping region that is overlapped with, and has a shape and size corresponding with the gate electrode in plan view;
a first separation region provided outside of the first overlapping region in plan view, and
a low resistance region provided outside the first separation region in plan view, such that the low resistance region is absent in both the first overlapping region and the first separation region in plan view,
a gate insulating film provided between the gate electrode and the oxide semiconductor film,
a first etching resistant film provided on a surface opposite to the gate insulating film of the gate electrode, the first etching resistant film having a width in a cross sectional view that is the same as a width of the gate electrode in a cross sectional view and including one of indium tin oxide, indium zinc oxide, and indium gallium zinc oxide, and
a first sidewall covering a side surface of the gate insulating film, and formed in contact with the first separation region of the oxide semiconductor film, and
wherein the capacitor shares the oxide semiconductor film of transistor, the capacitor including
the oxide semiconductor film,
a capacitor insulating film, and
a first electrode that faces the oxide semiconductor film with the capacitor insulating film interposed in between,
the oxide semiconductor film further including
a second overlapping region that is overlapped with, and has a shape and size corresponding with the first electrode in plan view, and
a second separation region provided outside of the second overlapping region in plan view, and
the low resistance region is provided outside the second separation region in plan view, such that the low resistance region is absent in both the second overlapping region and the second separation region in plan view, and a second sidewall provided on a side surface of the first electrode and on a side surface of the capacitor insulating film, and is in contact with the second separation region, wherein the low resistance region extends between the transistor and capacitor to connect the first and second separation regions.

11. The display unit according to claim 10, wherein the display element is an organic electroluminescence element.

12. An electronic apparatus provided with a display, the display being provided with a display element, a capacitor, and a transistor configured to drive the display element, the transistor comprising:

a gate electrode;

an oxide semiconductor film facing the gate electrode and including a first overlapping region that is overlapped with, and has a shape and size corresponding with the gate electrode in plan view;

a first separation region provided outside the first overlapping region in plan view, and a low resistance region provided outside the first separation region in plan view, such that the low resistance region is absent in both the first overlapping region and the first separation region in plan view, a gate insulating film provided between the gate electrode and the oxide semiconductor film, a first etching resistant film provided on a surface opposite to the gate insulating film of the gate electrode, the first etching resistant film having a width in a cross sectional view that is the same as a width of the gate electrode in a cross sectional view and including one of an indium tin oxide, an indium zinc oxide, and an indium gallium zinc oxide, and a first sidewall covering a side surface of the gate insulating film, and formed in contact with the first separation region, wherein the capacitor shares the oxide semiconductor film of transistor, the capacitor including the oxide semiconductor film, a capacitor insulating film, and a first electrode that faces the oxide semiconductor film with the capacitor insulating film interposed in between, the oxide semiconductor film further including a second overlapping region that is overlapped with, and has a shape and size corresponding with the first electrode in plan view, and a second separation region provided outside of the second overlapping region in plan view, and the low resistance region is provided outside the second separation region in plan view, such that the low resistance region is absent in both the second overlapping region and the second separation region in plan view, and a second sidewall provided on a side surface of the first electrode and on a side surface of the capacitor insulating film, and is in contact with the second separation region, wherein the low resistance region extends between the transistor and capacitor to connect the first and second separation regions.

13. The semiconductor device according to claim 1, wherein the first etching resistant film has etching resistance to dry etching higher than the etching resistance of the gate electrode.

* * * * *